United States Patent
Whetsel

(10) Patent No.: US 10,459,028 B2
(45) Date of Patent: Oct. 29, 2019

(54) SHADOW PROTOCOL CIRCUIT PRODUCING ENABLE, ADDRESS, AND ADDRESS CONTROL SIGNALS

(71) Applicant: TEXAS INSTRUMENTS INCORPORATED, Dallas, TX (US)

(72) Inventor: Lee D. Whetsel, Parker, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/043,468

(22) Filed: Jul. 24, 2018

(65) Prior Publication Data

US 2018/0328989 A1 Nov. 15, 2018

Related U.S. Application Data

(62) Division of application No. 15/467,485, filed on Mar. 23, 2017, now Pat. No. 10,054,633, which is a
(Continued)

(51) Int. Cl.
*G01R 31/317* (2006.01)
*G01R 31/28* (2006.01)
(Continued)

(52) U.S. Cl.
CPC ... *G01R 31/31713* (2013.01); *G01R 31/2815* (2013.01); *G01R 31/2884* (2013.01); *G01R 31/3025* (2013.01); *G01R 31/3177* (2013.01); *G01R 31/31703* (2013.01); *G01R 31/31725* (2013.01); *G01R 31/31727* (2013.01); *G01R 31/318558* (2013.01); *G01R 31/2851* (2013.01)

(58) Field of Classification Search
CPC ........ G01R 31/3025; G01R 31/318558; G01R 31/3177; G01R 31/2851; G01R 31/2815; G01R 31/31703; G01R 31/31727; G01R 31/31713; G01R 31/31725; G01R 31/2884
See application file for complete search history.

(56) References Cited

U.S. PATENT DOCUMENTS

| | | | |
|---|---|---|---|
| 5,887,001 A | 3/1999 | Russell | |
| 5,898,859 A | 4/1999 | Kardach et al. | |

(Continued)

OTHER PUBLICATIONS

Yuejian Wu and Liviu Calin, "Shadow write and read for at-speed BIST of TDM SRAMs," Proceedings International Test Conference 2001 (Cat. No. 01CH37260), Baltimore, MD, USA, 2001, pp. 985-994. (Year: 2001).*

(Continued)

*Primary Examiner* — Cynthia Britt
(74) *Attorney, Agent, or Firm* — Lawrence J. Bassuk; Charles A. Brill; Frank D. Cimino

(57) ABSTRACT

The disclosure describes a process and apparatus for accessing devices on a substrate. The substrate may include only full pin JTAG devices (504), only reduced pin JTAG devices (506), or a mixture of both full pin and reduced pin JTAG devices. The access is accomplished using a single interface (502) between the substrate (408) and a JTAG controller (404). The access interface may be a wired interface or a wireless interface and may be used for JTAG based device testing, debugging, programming, or other type of JTAG based operation.

6 Claims, 17 Drawing Sheets

Related U.S. Application Data division of application No. 15/159,171, filed on May 19, 2016, now Pat. No. 9,645,198, which is a division of application No. 14/815,396, filed on Jul. 31, 2015, now Pat. No. 9,372,230, which is a division of application No. 14/456,125, filed on Aug. 11, 2014, now Pat. No. 9,128,152, which is a division of application No. 13/488,956, filed on Jun. 5, 2012, now Pat. No. 8,839,060, which is a division of application No. 13/078,621, filed on Apr. 1, 2011, now Pat. No. 8,225,157, which is a division of application No. 12/883,629, filed on Sep. 16, 2010, now Pat. No. 7,945,832, which is a division of application No. 11/874,594, filed on Oct. 18, 2007, now Pat. No. 7,818,641.

(60) Provisional application No. 60/829,979, filed on Oct. 18, 2006.

(51) Int. Cl.
*G01R 31/302* (2006.01)
*G01R 31/3185* (2006.01)
*G01R 31/3177* (2006.01)

(56) References Cited

U.S. PATENT DOCUMENTS

| | | | |
|---|---|---|---|
| 6,052,808 A | 4/2000 | Wu et al. | |
| 6,418,545 B1 | 7/2002 | Adusumilli | |
| 6,425,100 B1 | 7/2002 | Bhattacharya | |
| 6,539,507 B1 | 3/2003 | Juenemann | |
| 6,601,189 B1 * | 7/2003 | Edwards ......... | G01R 31/31903 710/106 |
| 6,684,362 B1 | 1/2004 | Currier et al. | |
| 6,704,895 B1 | 3/2004 | Swoboda et al. | |
| 6,725,442 B1 | 4/2004 | Cote et al. | |
| 6,754,863 B1 | 6/2004 | Grannis, III | |
| 6,760,876 B1 | 7/2004 | Grannis, III | |
| 6,813,739 B1 | 11/2004 | Grannis, III | |
| 6,966,021 B2 | 11/2005 | Rajski et al. | |
| 7,487,419 B2 | 2/2009 | Mukherjee et al. | |
| 7,945,832 B2 | 5/2011 | Whetsel | |
| 8,839,060 B2 | 9/2014 | Whetsel | |
| 9,645,198 B2 | 5/2017 | Whetsel | |
| 2002/0083387 A1 | 6/2002 | Miner et al. | |
| 2003/0056154 A1 | 3/2003 | Edwards et al. | |
| 2004/0037303 A1 | 2/2004 | Joshi et al. | |
| 2004/0187049 A1 | 9/2004 | West | |
| 2004/0210805 A1 | 10/2004 | Kimelman et al. | |
| 2005/0257087 A1 | 11/2005 | Goff | |
| 2006/0100810 A1 | 5/2006 | Van De Logt et al. | |
| 2006/0156113 A1 | 7/2006 | Whetsel | |
| 2006/0179374 A1 | 8/2006 | Noble | |
| 2006/0212760 A1 | 9/2006 | Swoboda | |

OTHER PUBLICATIONS

Ley, A.W., "Doing more with less—An IEEE 1149.7 embedded tutorial :Standard for reduced-pin and enhanced-functionality test access port and boundary-scan architecture," in Test Conference, 2009. ITC 2009. International , vol., No., pp. 1-1 0, 1-6, Nov. 2009.

Jaehoon Song; Sungju Park, "A simple wrapped core linking module for SoC test access," in Test Symposium, 2002. (ATS '02). Proceedings of the 11th Asian , vol., No., pp. 344-349, Nov. 18-20, 2002.

Whetsel, L., "A High Speed Reduced Pin Count JTAG Interface," in Test Conference, 2006. ITC '06. IEEE International, vol., No., pp. 1-1 0, Oct. 2006.

"Enhanced reduced pin-count test for full-scan design" by Vranken This paper appears in: Test Conference, 2001. Proceedings. International Publication Date: 2001 on pp. 738-747.

R.N. Joshi et al., "Evolution of IEEE 1149.1Addressable Shadow Protocol Devices," Proceedings of the 2003 International Test Conference (ITC03), vol. 1, pp. 981-987, Sep. 30-Oct. 2, 2003.

Ogihara, T.; Murai, S.; Takamatsu, Y.; Kinoshita, K.; Fujiwara, H.;, "Test Generation for Scan Design Circuits with Tri-State Modules and Bidirectional Terminals," Design Automation, 1983. 20th Conference on , vol., No., pp. 71-78, Jun. 27-29, 1983.

Eberle. Hans, et al., "Testing Systems Wirelessly," Proceedings of the 22nd IEEE VLSI Test Symposium (VTS 2004).

MIPI Alliance, "MIPI Test and Debug Interface Framework, White Paper," Apr. 2006.

S. F. Oakland, "Combining IEEE Standard 1149.1 with reduced-pin-count component test," VLSI Test Symposium, 1991. 'Chip-to-System Test Concerns for the 90's', Digest of Papers, Atlantic City, NJ, USA, 1991, pp. 78-84.

Varma, Prab; "On Path Delay Testing in a Standard Scan Environment;" International Test Conference, 1994 IEEE.

S. K. Goel and E. J. Marinissen, "On-chip test infrastructure design for optimal multi-site testing of system chips," Design, Automation and Test in Europe, 2005, pp. 44-49 vol. 1.

J. Jahangiri, N. Mukherjee, Wu-Tung Cheng, S. Mahadevan and R. Press, "Achieving High Test Quality with Reduced Pin Count Testing," 14th Asian Test Symposium (ATS'05), 2005, pp. 312-317.

\* cited by examiner

SHADOW PROTOCOL CIRCUIT PRODUCING ENABLE, ADDRESS, AND ADDRESS CONTROL SIGNALS

CROSS REFERENCE TO RELATED PATENTS

This application is a divisional of prior application Ser. No. 15/467,485, filed Mar. 23, 2017, now U.S. Pat. No. 10,054,633, issued Aug. 21, 2018;

Which was a divisional of prior application Ser. No. 15/159,171, filed May 19, 2016, now U.S. Pat. No. 9,645,198, granted May 9, 2017;

Which was a divisional of prior application Ser. No. 14/815,396, filed Jul. 31, 2015, now U.S. Pat. No. 9,372,230, granted Jun. 21, 2016;

Which was a divisional of prior application Ser. No. 14/456,125, filed Aug. 11, 2014, now U.S. Pat. No. 9,128,152, granted Sep. 8, 2015;

Which was a divisional of prior application Ser. No. 13/488,956, filed Jun. 5, 2012, now U.S. Pat. No. 8,839,060, granted Sep. 16, 2014;

Which was a divisional of prior application Ser. No. 13/078,621, filed Apr. 1, 2011, now U.S. Pat. No. 8,225,157, granted Jul. 17, 2012;

Which was a divisional of prior application Ser. No. 12/883,629, filed Sep. 16, 2010, now U.S. Pat. No. 7,945,832, granted May 17, 2011;

which is a divisional of prior application Ser. No. 11/874,594, filed Oct. 18, 2007, now U.S. Pat. No. 7,818,641, granted Oct. 19, 2010;

which claims priority from Provisional Application No. 60/829,979, filed Oct. 18, 2006.

FIELD OF THE DISCLOSURE

This disclosure relates to an interface for accessing full and reduced pin JTAG devices on a substrate.

BACKGROUND OF THE DISCLOSURE

Electrical devices, which may be boards, ICs or embedded cores within ICs, require JTAG interfaces to provide testing and debugging of the device's hardware and software designs. In the past, device test and debug interfaces used the full pin JTAG interface consisting of TDI, TCK, TMS, TRST and TDO signal pins. The TRST pin is optional. More recently, reduced pin JTAG interfaces are being used for test and debug when device pins are not available for the full pin JTAG interface. Substrates, boards or ICs, containing both full and reduced pin JTAG devices will therefore require a full pin JTAG interface for accessing the full pin JTAG devices and a separate reduced pin JTAG interface for accessing the reduce pin JTAG devices. Requiring both a full and reduced pin JTAG interface on substrates complicates test and debug operations. Ideally, and according to the disclosure, substrate test and debug operations should be done without requiring the substrate to have both a full and reduced JTAG interface.

FIG. 1 illustrates an example of a full pin JTAG (FPJ) interface on a device. Full pin JTAG (IEEE 1149.1) interfaces comprising a TDI, TCK, TMS, TRST and TDO signals are well known and broadly used in the industry for testing, debugging, programming and/or other operations.

FIG. 2 illustrates an example of a reduced pin JTAG (RPJ) interface on a device. Reduced pin JTAG interfaces are relatively new in the industry and typically comprised no more than one or two interface signals to carry out test, debug, programming and/or other operations.

FIG. 2A illustrates an addressable type of RPJ interface that requires a clock (CLK) and a data I/O (DIO) signal. This type of RPJ interface is described in detail in a 2006 IEEE International Test Conference paper by Whetsel titled "A High Speed Reduced Pin Count JTAG Interface", which is incorporated and referenced herein.

FIG. 2B illustrates another addressable type of RPJ interface that requires a clock (TCK) and a data I/O (TMSC) signal. This type of RPJ interface is the subject of developing IEEE standard P1149.7 and described in a 2006 white paper titled "MIPI Test and Debug Interface Framework", which is incorporated and referenced herein.

FIG. 2C illustrates a non-addressable type of RPJ interface that requires only a single I/O signal referred to as a JTAG Link (JLINK) signal. This JLINK interface was developed by DebugInnovation. The JLINK interface is described on DebugInnovation's website, which is incorporated and referenced herein.

FIG. 2D illustrates a non-addressable type of RPJ interface that requires only a single I/O signal referred to as a Single Wire JTAG (SWJ) signal. This SWJ interface was developed by ARM Ltd. The SWJ interface is described on ARM's website, which is incorporated and referenced herein.

While each of the addressable and non-addressable RPJ interfaces of FIG. 2A-2D are operationally different, they can all be used to achieve a RPJ interface for device test, debug, programming and other operations. Throughout the remainder of this description the term RPJ interface is general and can be used to reference any of the RPJ interfaces shown in FIGS. 2A-2D, as well as any other type of RPJ interface.

FIG. 3 illustrates a substrate 302, which can be a system, board or IC, that includes one or more FPJ (304) devices and one or more RPJ (306) devices. While plural FPJ devices 304 are shown in a daisy-chain, a single FPJ device may exist as well. Further, while plural addressable RPJ devices 306 are shown bussed together, a single non-addressable RPJ device 306 may exist as well. The devices 304-306 can be boards in a system, ICs on a board, or cores within an IC. As seen the FPJ devices 304 require a full pin JTAG interface 308 to a FPJ controller 310 and the RPJ devices 306 require a separate reduced pin interface 312 to a separate RPJ controller 314. Thus for test, debug, programming or other operations, the substrate 302 disadvantageously requires two separate JTAG interface 308 and 312 coupled to two separate JTAG controllers 310 and 314.

The disclosure, as will be described in detail below, does not require substrates 302 to have two separate JTAG interface 308 and 312 each coupled to two separate JTAG controllers 310 and 314. Advantageously therefore, the disclosure provides for substrate test, debug, programming and other operations to FPJ and RPJ devices to occur over a single interface coupled to a single JTAG controller. In the following description JTAG access FPJ or RPJ device interfaces includes access required for device testing, device debug, device programming, or any other operation performed using a FPJ or RPJ device interface.

BRIEF SUMMARY OF THE DISCLOSURE

The disclosure provides a process and apparatus for providing a single JTAG controller to access FPJ and RPJ devices residing on a substrate using only a single interface between the JTAG controller and substrate.

DETAILED DESCRIPTION OF THE DISCLOSURE

Figure 4:
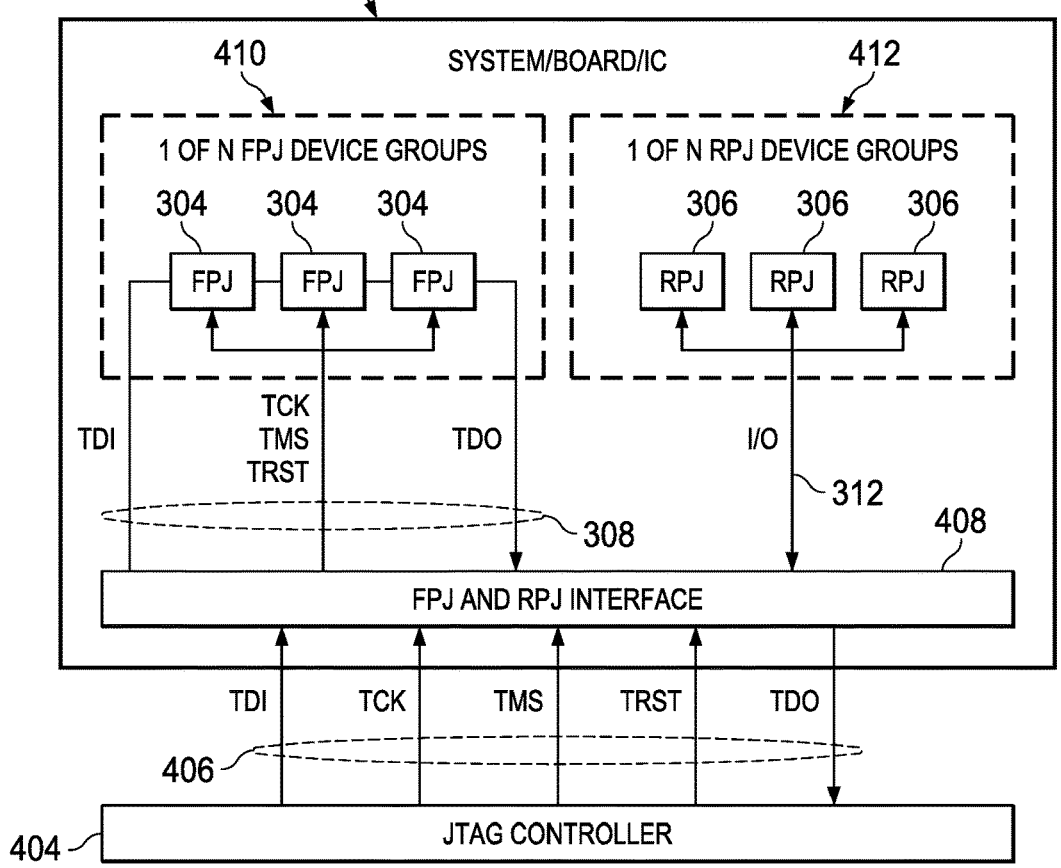
FIG. 4 illustrates a substrate containing FPJ and RPJ devices interfaced to a single JTAG controller via a FPJ & RPJ Interface according to the disclosure.

FIG. 4 illustrates a substrate 402 that includes the FPJ and RPJ device access architecture of the disclosure. As seen, the architecture includes an FPJ & RPJ Interface circuit 408 that is coupled to; (1) a group 410 of FPJ devices 304 via FPJ interface 308, (2) a group 412 of RPJ devices 306 via RPJ interface 312, and (3) a JTAG controller 404 via a JTAG interface bus 406. Any number of groups 410 of one or more FPJ devices 304 may be coupled to JTAG controller 404 by separate FPJ interfaces 308. Any number of groups 412 of one or more RPJ devices 306 may be coupled to JTAG controller 404 by separate RPJ interfaces 312. The JTAG controller 404 may access a group of one or more FPJ devices or a group of one or more FPJ devices by the FPJ & RPJ interface circuit 408 via JTAG interface bus 406.

Figure 5:
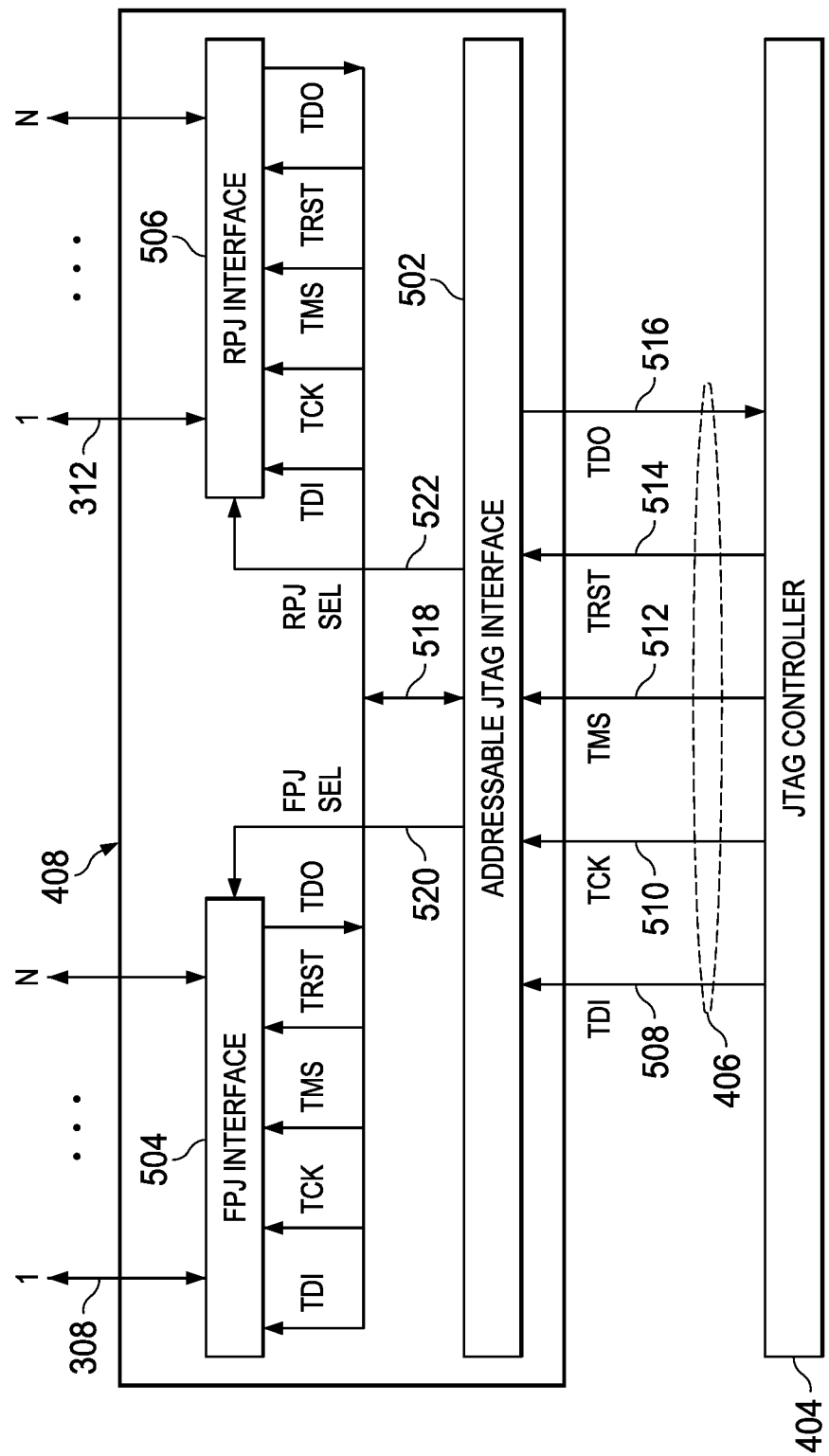
FIG. 5 illustrates the FPJ & RPJ Interface of FIG. 4.

FIG. 5 illustrates in more detail the FPJ & RPJ Interface circuit 408 of FIG. 4. As seen, circuit 408 comprises an addressable JTAG interface 502, a FPJ interface 504, and a RPJ interface 506. The JTAG interface 502 is coupled to a JTAG controller 404 via bus 406 which includes a TDI 508, TCK 510, TMS 512, TRST 514, and TDO 516 signal. The TDI 508 signal provides data input from the JTAG controller 404. The TCK 510 signal provides clock input from the JTAG controller 404. The TMS 512 signal provides control input from the JTAG controller 404. The TRST 514 signal provides reset input from the JTAG controller 404. The TDO 516 signal provides data output to the JTAG controller 404. The JTAG interface 502 is coupled to the FPJ interface 504 via busses 518 and 520 and to RPJ interface 506 via busses 518 and 522. The FPJ interface 504 interfaces to one or more (N) FPJ device groups 410 via FPJ busses 308. The RPJ interface 506 interfaces to one or more (N) RPJ device groups 412 via RPJ busses 312.

Figure 6:
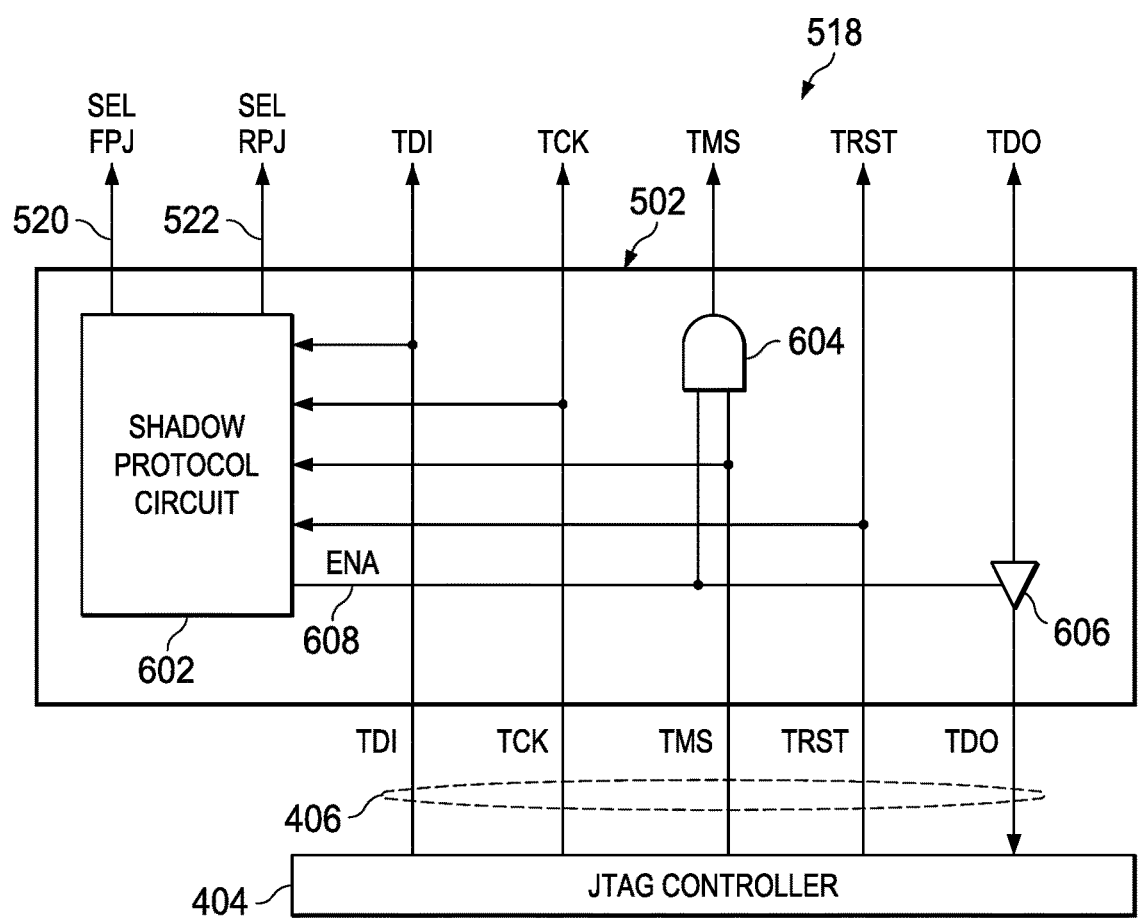
FIG. 6 illustrates the addressable JTAG interface of FIG. 5.

FIG. 6 illustrates the addressable JTAG interface 502 in more detail, which comprises a shadow protocol circuit 602, And gate 604, and 3-state buffer 606. Addressable JTAG Circuit 602 inputs the TDI, TCK, TMS and TRST signals from bus 406 and outputs a select FPJ (SELFPJ) bus 520 to FPJ interface 504, a select RPJ (SELRPJ) bus 522 to RPJ interface 506, and an enable (ENA) signal 608 to And gate 604 and 3-state buffer 606. The SELFPJ bus 520 is used to select an FPJ device group 410 for access, the SELRPJ bus 522 is used to select an RPJ device group 412 for access, and the ENA signal 608 enables And gate 604 and 3-state buffer 606, to provide for bus 406 to be fully coupled to bus 518. When bus 406 is fully coupled to bus 518, the selected FPJ 410 or RPJ 412 device group may be accessed by the JTAG controller 404 via bus 406.

Figure 7:
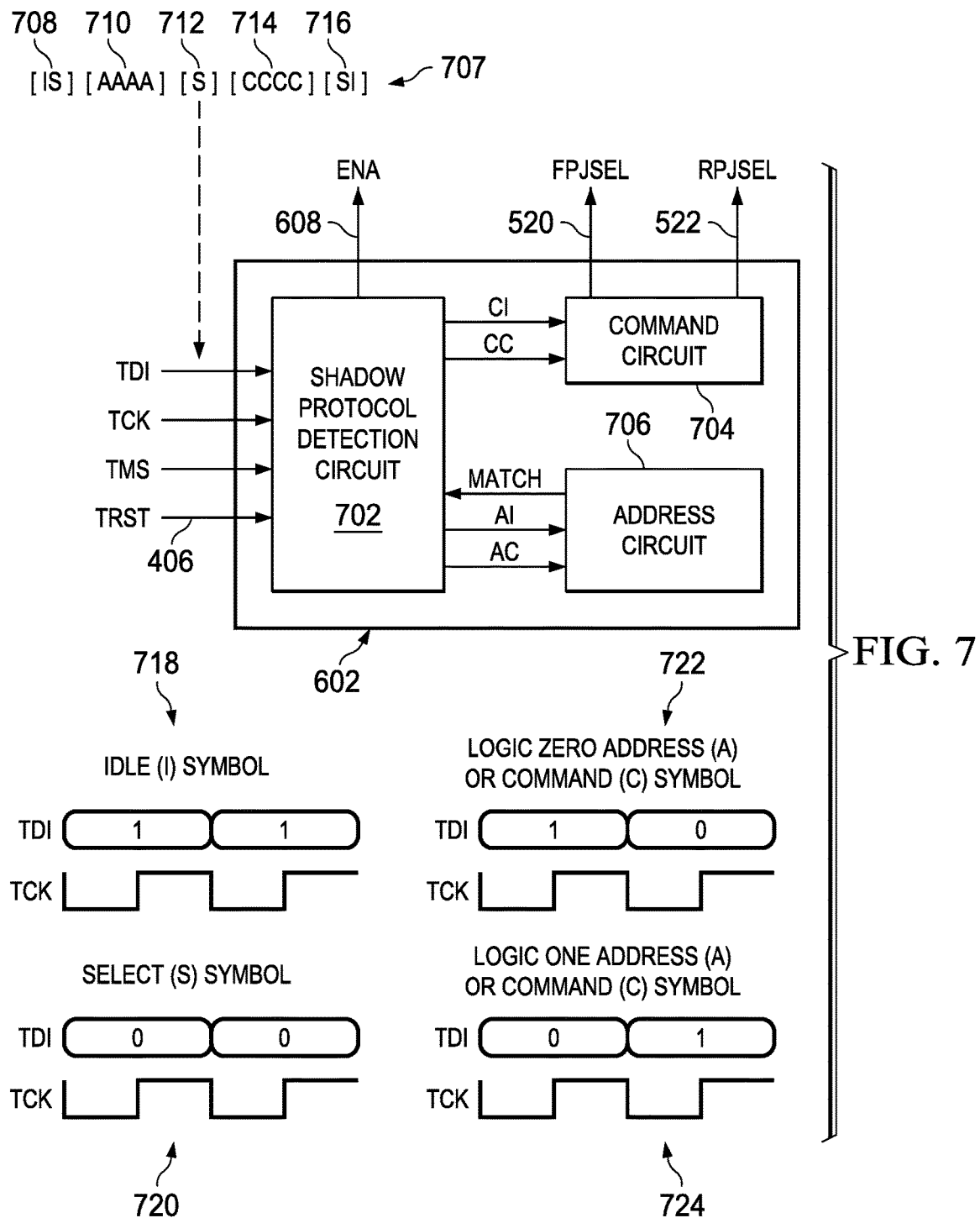
FIG. 7 illustrates the shadow protocol circuit of FIG. 6.

FIG. 7 illustrates the shadow protocol circuit 602 in more detail, which comprises a shadow protocol detection circuit 702, command circuit 704, and address circuit 706. The shadow protocol detection circuit 602 inputs the TDI, TCK, TMS and TRST signals from bus 406 and a match signal from address circuit 706. The detection circuit 702 outputs a command input (CI) signal and command control signals (CC) to command circuit 704 and an address input (AI) signal and address control signals (AC) to address circuit 706. The command circuit 704 outputs the FPJSEL bus 520 to FPJ interface 504 and the RPJSEL bus 522 to RPJ interface 522.

Figure 8A:
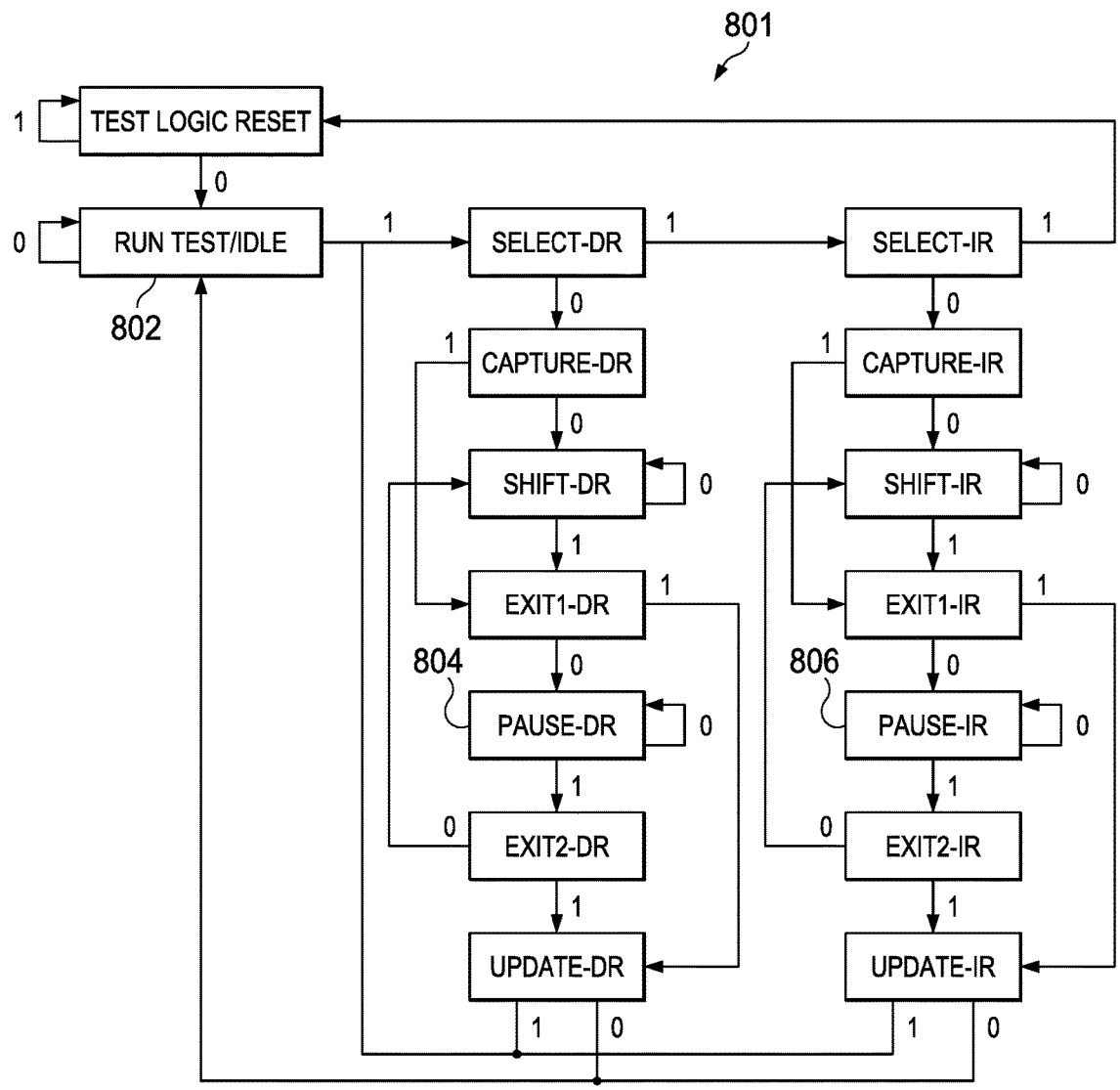
FIG. 8A illustrates the state diagram of an IEEE 1149. TAP state machine.

When the JTAG controller 404 is in the RunTest/Idle state 802, the Pause-DR state 804, or the Pause-IR state 806 of the IEEE 1149.1 TAP state diagram 801 of FIG. 8A, the Detection circuit 702 is enabled to respond to a shadow protocol message 707 input on TDI to input address data to the address circuit 704 and command data to the command circuit 706. If the JTAG controller 404 is not in one of these states 802-806, the detection circuit 702 is disabled from responding to the message 707. The detection circuit and all FPJ and FPJ devices coupled to the FJP & RPJ interface 408 are reset by the TRST signal going low or by the JTAG bus 406 transitioning to the Test Logic Reset state of FIG. 8A.

The shadow protocol message 707 consists of a start field 708 comprising an idle symbol (I) 718 and a select symbol (S) 720, an address field 710 comprising a number of logic one or zero address symbols (A) 722 and 724, a delimiter field 712 comprising a select symbol (S) 720, a command field 714 comprising a number of logic one or zero command symbols (C) 722 and 724, and a stop field 716 comprising a select symbol (C) 720 and an idle symbol (I) 718. The symbols 718-724 are each defined by a pair of logic bits, with the I symbol 718 being two logic ones, the S symbol 720 being two logic zeros, the logic zero A or C symbol 722 being a logic one followed by a logic zero, and the logic one A or C symbol 724 being a logic zero followed by a logic one. As seen, the TCK times the symbol bit pair inputs on TDI. If desired the symbol bit pair definitions may be defined differently from that shown in examples 718-724.

Figure 8B:
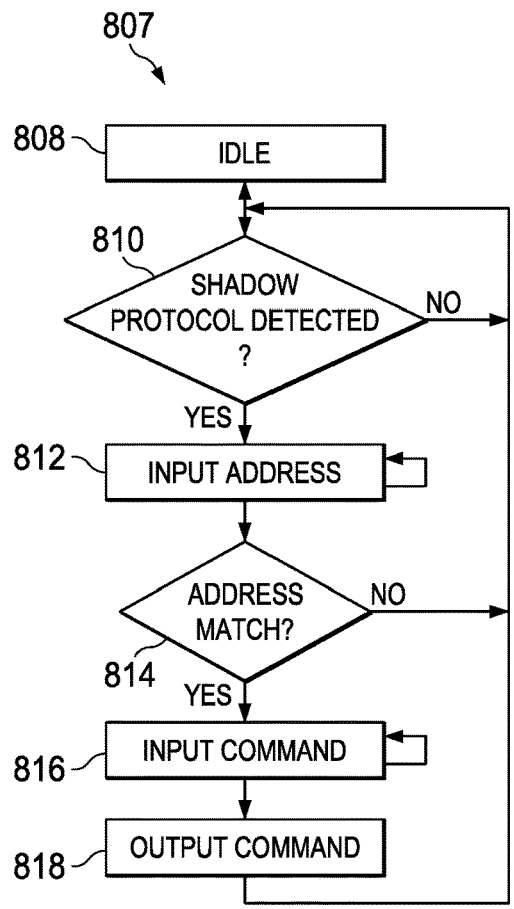
FIG. 8B illustrates the state diagram of the shadow protocol detection circuit of FIG. 7.

FIG. 8B illustrates the state diagram 807 of the detection circuit 702. If the JTAG bus 406 is not in TAP states 802, 804, or 806, the detection circuit 702 will be in the idle state 808. If the JTAG bus 406 is in state 802, 804 or 806, the detection circuit 702 transitions to state 810 to enable the detection of a shadow protocol message 707. If a message start field 708 occurs in state 810 the detection circuit 702 transitions to state 812 to input an address field 710 to the address circuit 704. When the delimiter field 712 occurs at the end of an address field input, the detection circuit transitions to state 814 to evaluate the match signal output from address circuit 706 to determine if the address input to the address circuit 704 matches the address of the FPJ & RPJ interface 408. If it does not match, the detection circuit transitions to and remains in state 810 for the remainder of the message 707. If it does match, the detection circuit transitions to state 816 to enable the command circuit 706 for receiving a command field 714. When the stop field 716 occurs at the end of the command field 714 input, the detection circuit transitions to state 818 to output the command data on the FPJSEL 520 and RPJSEL 522 busses to select an FPJ device group 410 or an RPJ device group 412 for access and to output the ENA signal 608 to fully couple busses 406 and 518. From state 818, the detection circuit 702 transitions to state 810. When the JTAG bus 406 transitions out of state 802, 804 or 806 to resume JTAG operations, the detection circuit 702 returns to the idle state 808.

Following the above described shadow protocol message input 707, the selected FPJ 520 or RPJ 522 device group can be accessed by transitioning through the states of the IEEE 1149.1 TAP state diagram 801. When access to another FPJ 520 or RPJ 522 device group is desired, the above described process is repeated.

Figure 8C:
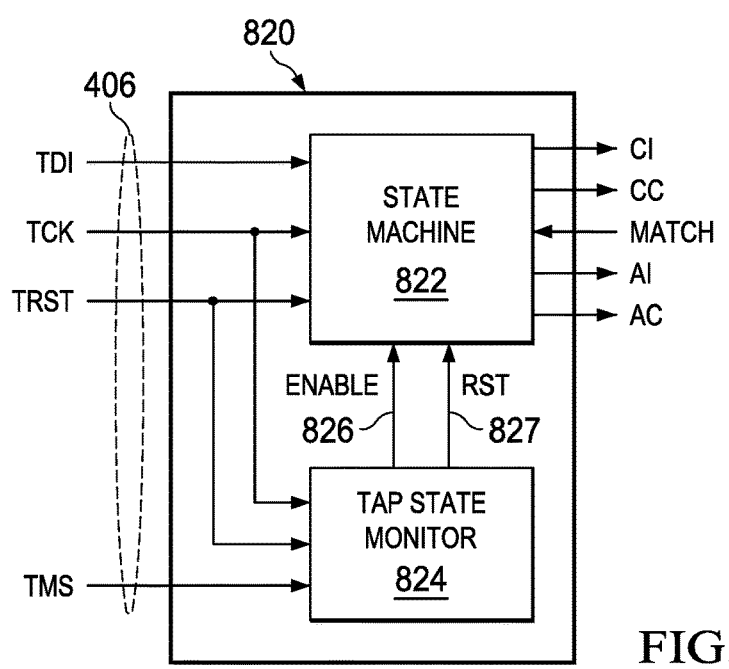
FIG. 8C illustrates an example implementation of the shadow protocol detection circuit of FIG. 7.

FIG. 8C illustrates an example implementation 820 of the shadow protocol detection circuit 702, which consists of a state machine 822 and a TAP state monitor 824. The TAP state monitor is basically an IEEE 1149.1 TAP that is used to track the state of the JTAG bus 406. The TAP state monitor 824 outputs a RST signal 827 and an Enable signal 826 to the state machine 822. The TAP state monitor 824 outputs a low on RST 827 whenever the JTAG bus 406 transitions to the Test Logic Reset state of FIG. 8A. The TAP state monitor 824 outputs a high on the Enable signal 826 to state machine 822 whenever the JTAG bus 406 is in the RunTest/Idle state, the Pause-DR state, or the Pause-IR state. If the Enable signal 826 is low the JTAG bus 406 is not in one of these states and the state machine 822 will be forced to the idle state 808 of FIG. 8B. If the enable signal 826 is high the JTAG bus 406 is in one of these states and the state machine 822 will transition to state 810 of FIG. 8B to look for the start field 708 of a message 707.

When a message is started, state machine 822 will transition to state 812 of FIG. 8B to decode the address symbols (A) input from TDI during address input field 710 into logic one or zero bits and output these bits on AI to the address circuit 706. The state machine outputs address control (AC) to the address circuit 706 to cause the AI bits to be input to the address circuit 706. In response to detecting the delimiter field 712 the state machine 822 will transition to state 814 to interpret the Match signal from address circuit 706 as previously described. If an address match is detected, the state machine transitions to state 816 to decode the command symbols (C) input from TDI during command input field 714 into logic one or zero bits and output these bits on CI to the command circuit 704. If an address match does not occur, state machine 822 transitions to state 810 of FIG. 8B. A transition from state 814 to state 810, as a result of an address mismatch, sets the ENA signal 608 output from state machine 822 low to disable And gate 604 and TDO 3-state buffer 606, which fully decouples bus 406 from bus 518 of FIG. 6.

During command bit outputs to command circuit 704, the state machine 822 outputs command control (CC) to the command circuit 704 to cause the command bits to be input to the command circuit 704. In response to the stop field 716, the state machine 822 stops command bit inputs to command circuit 704, transitions to state 818 of FIG. 8B to output control on CC to cause the command (FPJSEL bus 520 and RPJSEL bus 522) to be output from the command circuit 704. Also in state 818, the state machine 822 sets the ENA signal 608 high to enable And gate 604 and TDO 3-state buffer 606 of FIG. 6 to fully couple busses 406 and 518.

In response to a low on TRST of JTAG bus 406, the state machine 822, TAP state monitor 824, address circuit 706, and command circuit 704 are reset. Also in response to the RST input 827 from TAP state monitor 824 the state machine 822, address circuit 706, and command circuit 704 are reset.

Figure 8D:
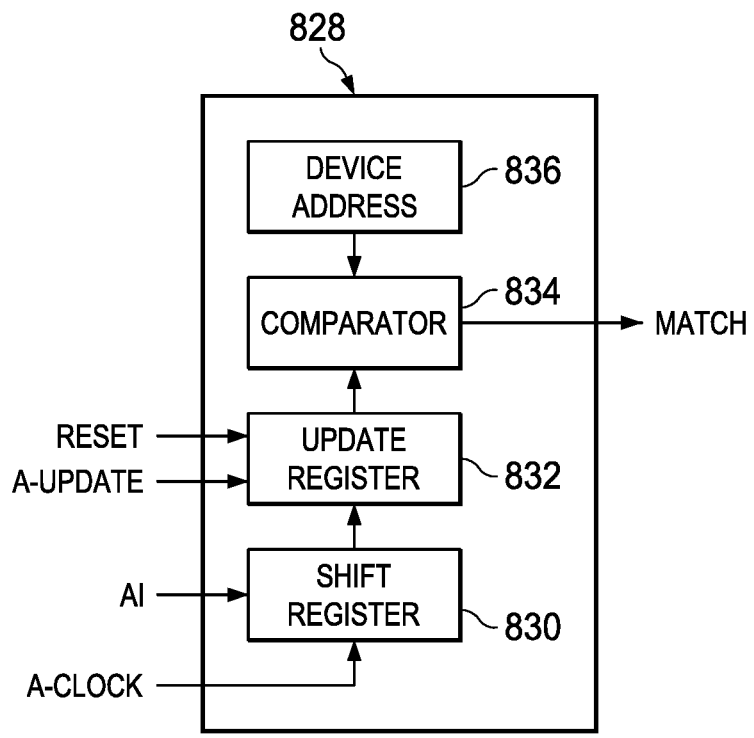
FIG. 8D illustrates an example implementation of the address circuit of FIG. 7.

FIG. 8D illustrates an example implementation 828 of the address circuit 706, which comprises a shift register 830, update register 832, comparator 834, and device address 836. The shift register 830 receives the address bit input (AI) and an A-Clock input from state machine 822. The A-clock input is a signal on the AC bus and is used to clock in the address bits from the AI input during state 812 of FIG. 8B. The update register 832 inputs the parallel address output from shift register 830 in response to an A-Update signal from the AC bus. The update register 832 outputs the updated address to comparator 834 during state 814 of FIG. 8B. The comparator compares the address output from the update register to the device address 836. If the addresses match, the Match signal from the comparator is set high. If the addresses do not match, the Match signal from the comparator is set low.

In response to a reset output from state machine 822 on the AC bus, as a result of the state machine receiving a low on the TRST or RST input, the update register 832 is reset to an address value that will not match the device address 836.

Figure 8E:
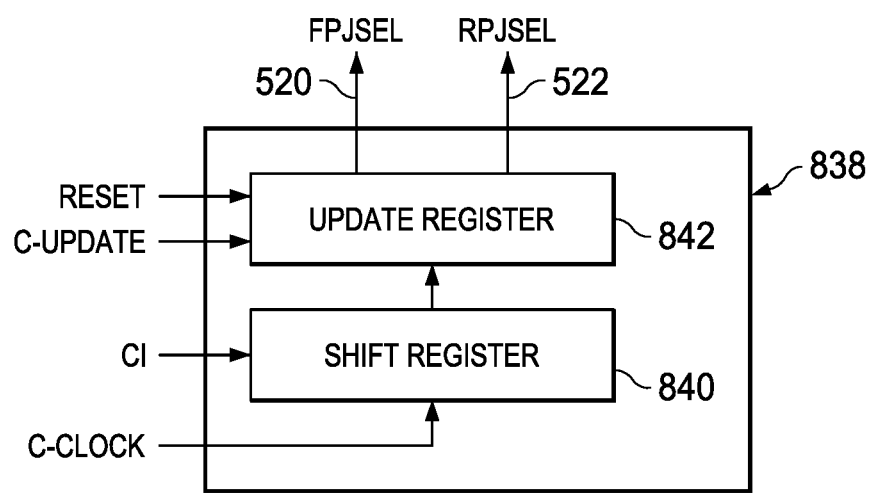
FIG. 8E illustrates an example implementation of the command circuit of FIG. 7.

FIG. 8E illustrates an example implementation 838 of the command circuit 704, which comprises a shift register 840 and an update register 842. The shift register 840 receives the command bit inputs (CI) and a C-Clock input from state machine 822. The C-clock input is a signal on the CC bus and is used to clock in the command bits from the CI input during state 816 of FIG. 8B. The update register 842 inputs the parallel command output from shift register 840 in response to a C-Update signal from the CC bus during state 818 of FIG. 8B. The update register 842 outputs the updated command to the FPJSEL bus 520 and RPJSEL bus 522.

In response to a reset output from state machine 822 on the CC bus, as a result of the state machine receiving a low on the TRST or RST input, the update register 842 is reset to a value where the FPJSEL bus 520 does not select an FPJ device group and the RPJSEL bus 522 does not select a RPJ device group. Also in response to a TRST or RST input, the state machine sets the ENA signal 608 low to decouple busses 406 and 518 of FIG. 6.

Figure 9:
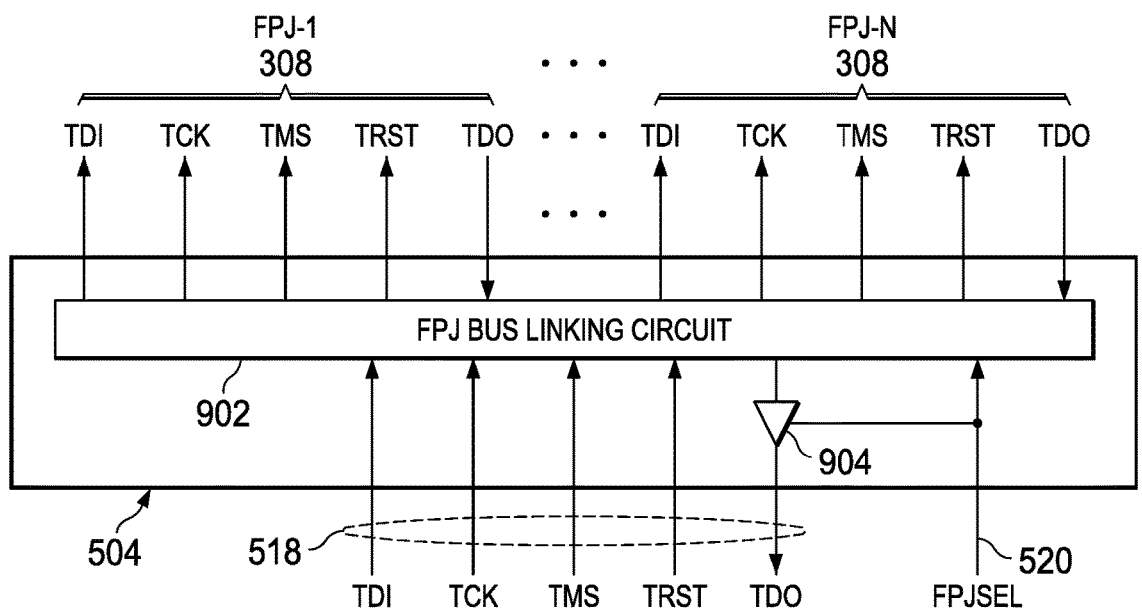
FIG. 9 illustrates the FPJ interface of FIG. 5.

FIG. 9 illustrates the FPJ interface 504 of FIG. 5 in more detail. The FPJ interface comprises an FPJ bus linking circuit 902 and a TDO 3-state buffer 904. The linking circuit 902 is coupled to the JTAG bus 518 and the FPJSEL bus 520 from the addressable JTAG interface circuit 502 and to FPJ device groups 410 via one or more JTAG busses 308. The control input of the TDO 3-state buffer 904 is coupled to a signal from the FPJSEL bus 520.

In response to an FPJ selection input on FPJSEL bus 520, and when only one FPJ device group 410 is being accessed, the linking circuit 902 couples bus 518 to a selected bus 308 such that; TDI of bus 518 drives TDI of selected bus 308, TCK of bus 518 drives TCK of selected bus 308, TMS of bus 518 drives TMS of selected bus 308, and TDO of selected bus 308 drives TDO of bus 518, via the TDO 3-state buffer 904.

In response to an FPJ selection input on FPJSEL bus 520, and when a first and a second FPJ device group 410 are being accessed in a daisy-chain, the linking circuit 902 couples bus 518 to the selected first and second FPJ device groups 410, via their busses 308, such that; TDI of bus 518 drives TDI of the first selected bus 308, TCK of bus 518 drives TCK of both first and second selected busses 308, TMS of bus 518 drives TMS of both first and second selected busses 308, TDO of the first selected bus 308 drives TDI of the second select bus 308, and TDO of the second selected bus 308 drives TDO of bus 518, via the TDO 3-state buffer 904.

The daisy-chaining of more than two FPJ device groups 410 is achieved by simply inputting control on FPJSEL bus 520 to select more than two FPJ device groups 410, which couples TCK and TMS of bus 518 to all the selected FPJ device groups 410 via their busses 308, daisy-chains the TDI of bus 518 to the TDI of the first FPJ device group 410 via its bus 308, forms TDO to TDI couplings between each intermediate FPJ device group 410 via their busses 308, and finally coupling the TDO of the last selected FPG device group 410 to the TDO of bus 518 via TDO 3-state buffer 904.

Figure 10:
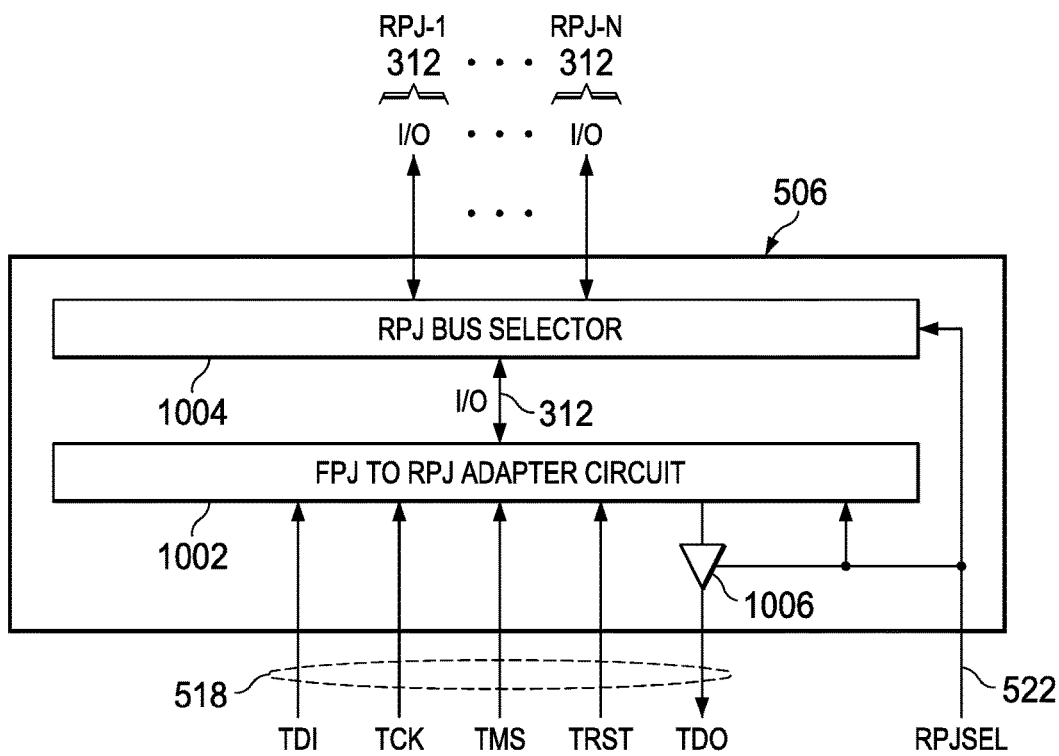
FIG. 10 illustrates the RPJ interface of FIG. 5.

FIG. 10 illustrates the RPJ interface 506 of FIG. 5 in more detail. The RPJ interface comprises a FPJ to RPJ adapter circuit 1002, a RPJ bus selector circuit 1004, and a TDO 3-state buffer 1006. The adapter circuit 1002 is coupled to the JTAG bus 518 and the RPJSEL bus 522 from the addressable JTAG interface circuit 502 and to the RPJ bus selector circuit 1004 via an RPJ I/O bus 312. The RPJ bus selector 1004 is coupled to the RPJSEL bus 522 and to one or more RPJ I/O busses 312. The control input of the TDO 3-state buffer 1006 is coupled to a signal from the RPJSEL bus 522.

In response to an RPJ selection input on RPJSEL bus 522 the adapter circuit 1002 and buffer 1006 are enabled and the bus selector circuit 1004 couples the I/O bus 312 from adapter circuit 1002 to a selected I/O bus 312 coupled to a RPJ device group 412. Non-selected I/O busses 312 from selector circuit 1004 are not coupled to I/O bus 312 from adapter circuit 1002. Following the RPJ selection input on RPJSEL bus 522, the selected RPJ device group 412 may be access by the JTAG bus 518 via the adapter circuit 1002 and selector circuit 1004. During the access, the adapter circuit 1002 operates to convert the JTAG protocol on bus 518 into an RPJ protocol such that RPJ interface 506 can communicate with the selected RPJ device group 412 via selector circuit 1004.

Figure 1:
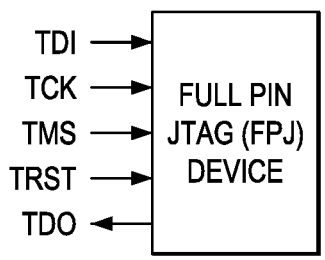
FIG. 1 illustrates a full pin JTAG (FPJ) interface for accessing a device.
Figure 2:
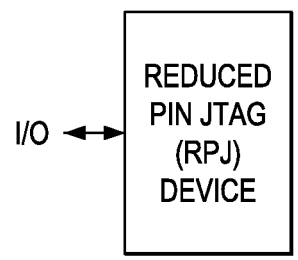
FIG. 2 illustrates a reduced pin JTAG (RPJ) interface for accessing a device.
Figure 2A:
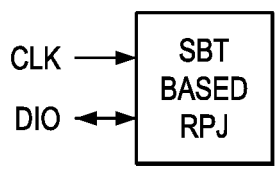
FIG. 2A illustrates a device including a first known type of RPJ interface.
Figure 10A:
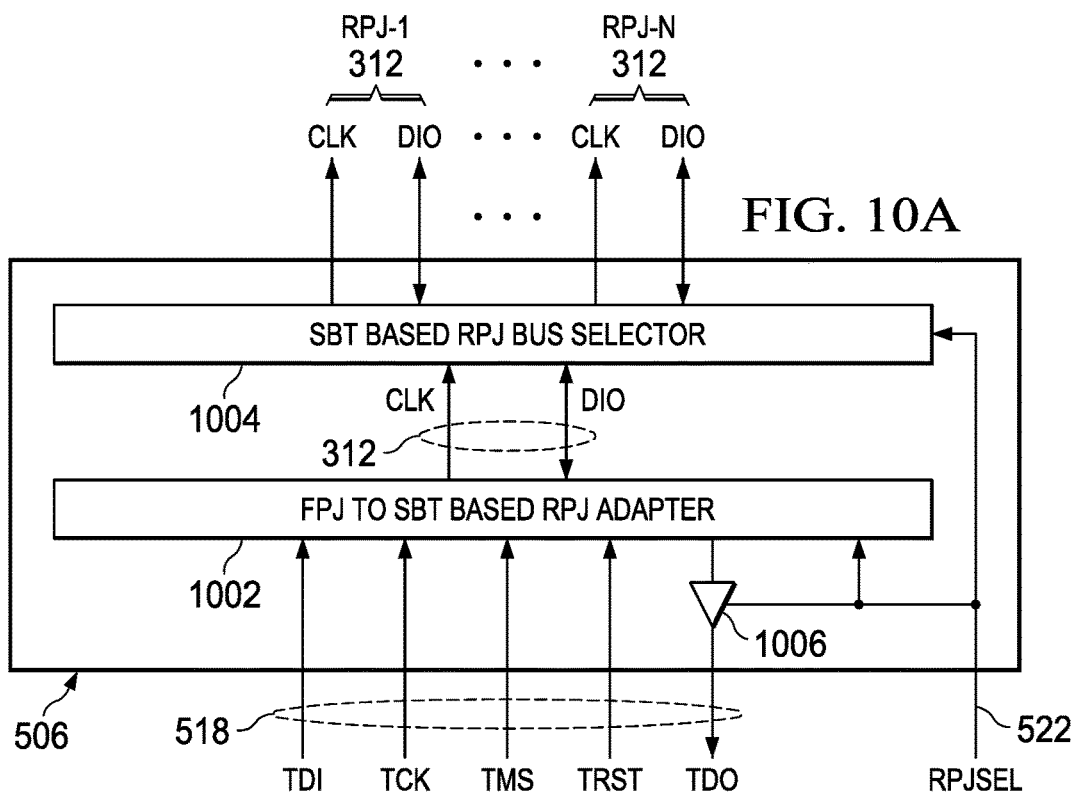
FIG. 10A illustrates the RPJ interface of FIG. 10 designed to adapt an FPJ interface into a number of separate SBT Based RPJ interfaces.

FIG. 10A illustrates an example RPJ interface 506 for communicating with the previously mentioned SBT based RPJ devices of FIG. 2A. In this example the adapter circuit 1002 is designed to convert the JTAG protocol on bus 518 into the two signal (CLK & DIO) SBT based protocol on bus 312 for communicating with a selected SBT based RPJ device group 412 via selector 1004. An example SBT based adapter 1002 is described in the referenced Whetsel paper. In this example, the SBT based RPJ bus selector 1004 is designed to couple the selected SBT based bus 312 of an SBT based device group 412 to the SBT based bus 312 from adapter 1002.

Figure 2B:
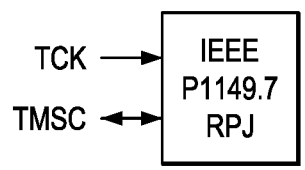
FIG. 2B illustrates a device including a second known type of RPJ interface.
Figure 10B:
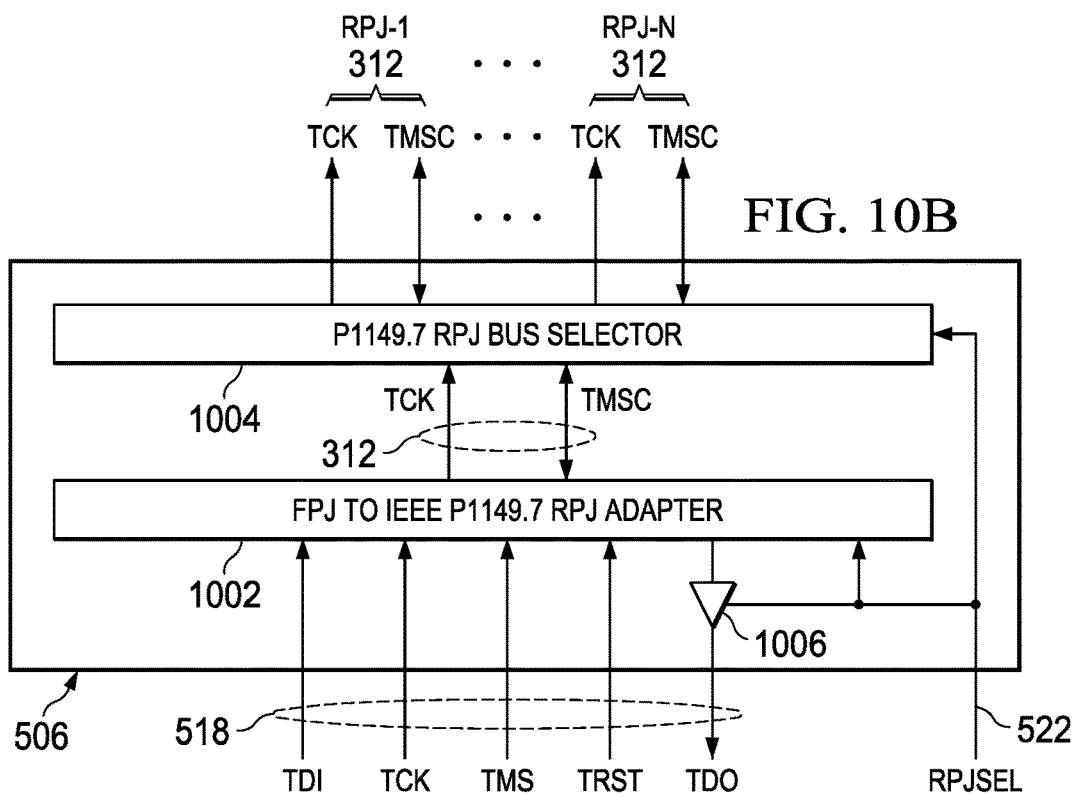
FIG. 10B illustrates the RPJ interface of FIG. 10 designed to adapt an FPJ interface into a number of separate IEEE P1149.7 RPJ interfaces.

FIG. 10B illustrates an example RPJ interface 506 for communicating with the previously mentioned IEEE P1149.7 RPJ devices of FIG. 2B. In this example the adapter circuit 1002 is designed to convert the JTAG protocol on bus 518 into the two signal (TCK & TMSC) P1149.7 protocol on bus 312 for communicating with a selected P1149.7 RPJ device group 412 via selector 1004. An example P1149.7 adapter 1002 is described in the referenced P1149.7 white paper. In this example, the P1149.7 RPJ bus selector 1004 is designed to couple the selected P1149.7 bus 312 of a P1149.7 device group 412 to the P1149.7 bus 312 from adapter 1002.

Figure 2C:
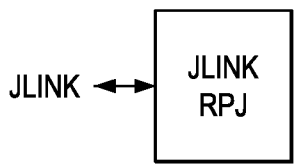
FIG. 2C illustrates a device including a third known type of RPJ interface.
Figure 10C:
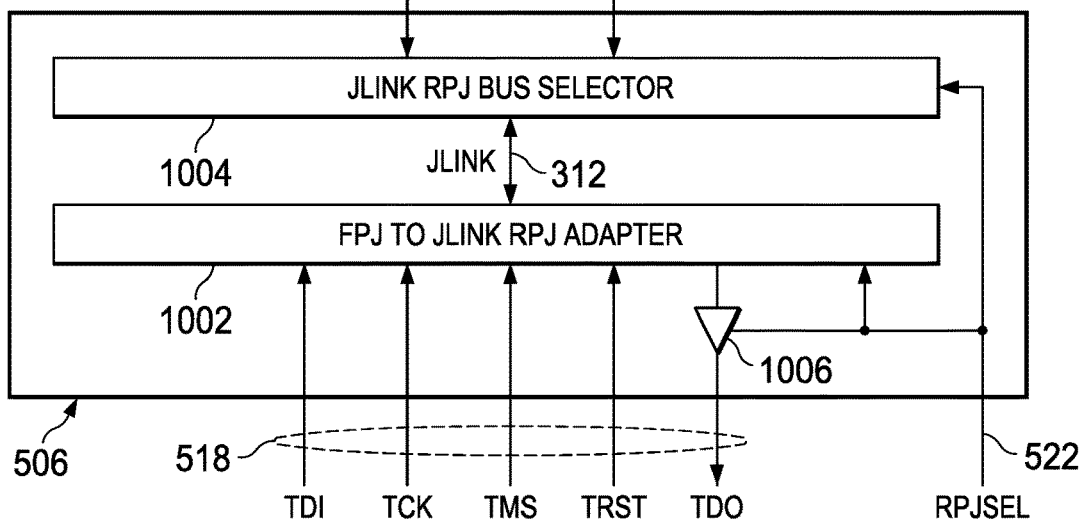
FIG. 10C illustrates the RPJ interface of FIG. 10 designed to adapt an FPJ interface into a number of separate JLINK RPJ interfaces.

FIG. 10C illustrates an example RPJ interface 506 for communicating with the previously mentioned JLINK RPJ devices of FIG. 2C. In this example the adapter circuit 1002 is designed to convert the JTAG protocol on bus 518 into the single signal JLINK protocol on bus 312 for communicating with a selected JLINK RPJ device 412 via selector 1004. An example JLINK adapter 1002 is described on the referenced JLINK website. In this example, the JLINK RPJ bus selector 1004 is designed to couple the selected JLINK bus 312 of a JLINK device 412 to the JLINK bus 312 from adapter 1002.

Figure 2D:
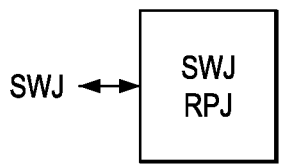
FIG. 2D illustrates a device including a fourth known type of RPJ interface.
Figure 3:
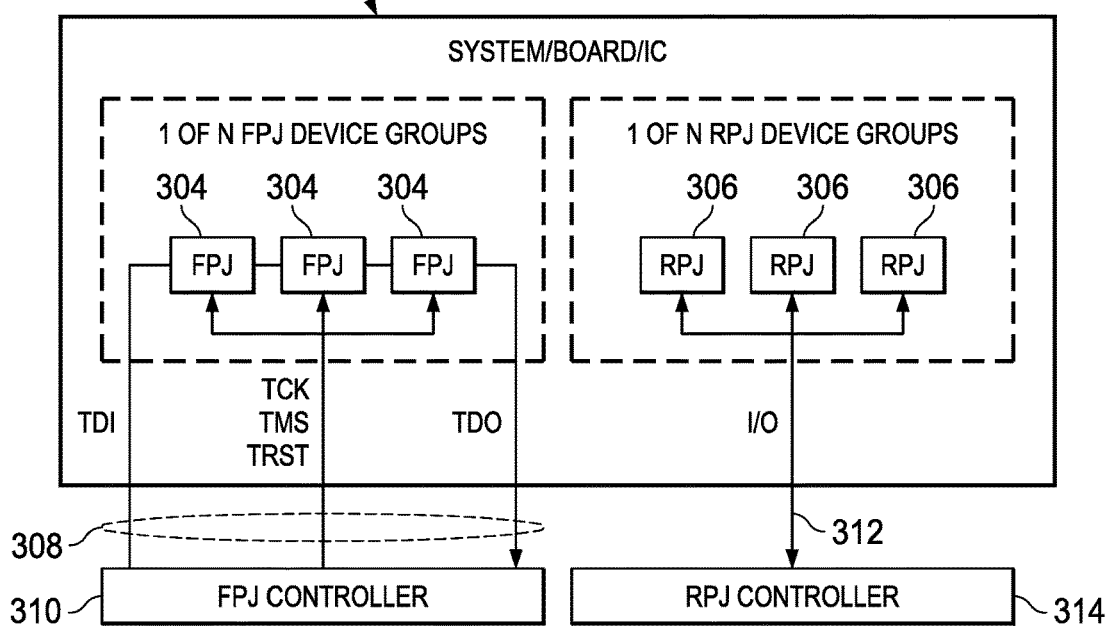
FIG. 3 illustrates a substrate containing FPJ and RPJ devices interfaced to separate FPJ and RPJ controllers.
Figure 10D:
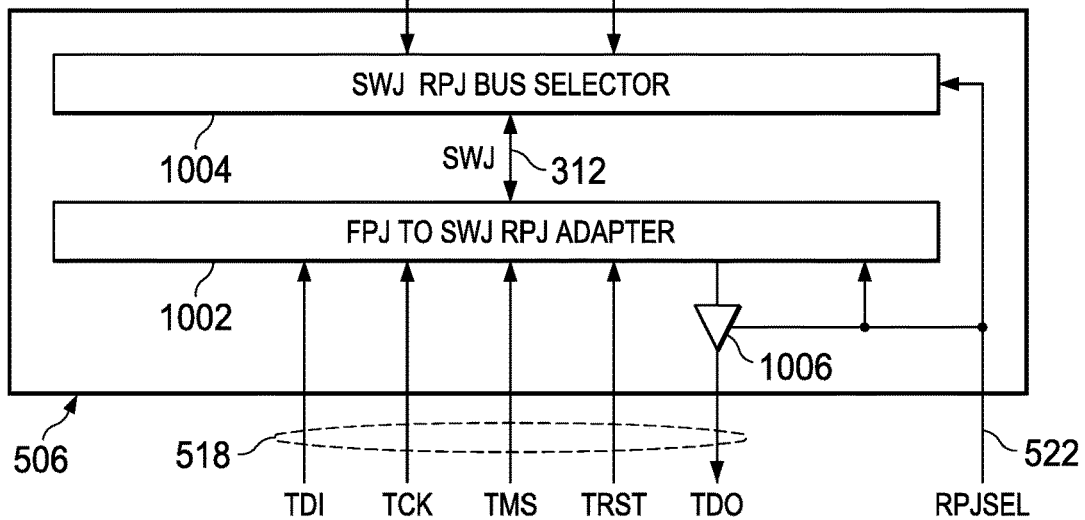
FIG. 10D illustrates the RPJ interface of FIG. 10 designed to adapt an FPJ interface into a number of separate SWJ RPJ interfaces.

FIG. 10D illustrates an example RPJ interface 506 for communicating with the previously mentioned SWJ RPJ devices of FIG. 2D. In this example the adapter circuit 1002 is designed to convert the JTAG protocol on bus 518 into the single signal SWJ protocol on bus 312 for communicating with a selected SWJ RPJ device 412 via selector 1004. An example SWJ adapter 1002 is described on the referenced ARM website. In this example, the SWJ RPJ bus selector 1004 is designed to couple the selected SWJ bus 312 of a SWJ device 412 to the SWJ bus 312 from adapter 1002.

While FIGS. 10A-10D have shown how the RPJ interface 506 can communicate with four known types of RPJ device interfaces, it is not limited to communicating with only these four RPJ device interfaces. In general, the adapter 1002 and selector 1004 of the RPJ interface 506 can be designed to interface to any type of RPJ device interfaces.

Figure 11:
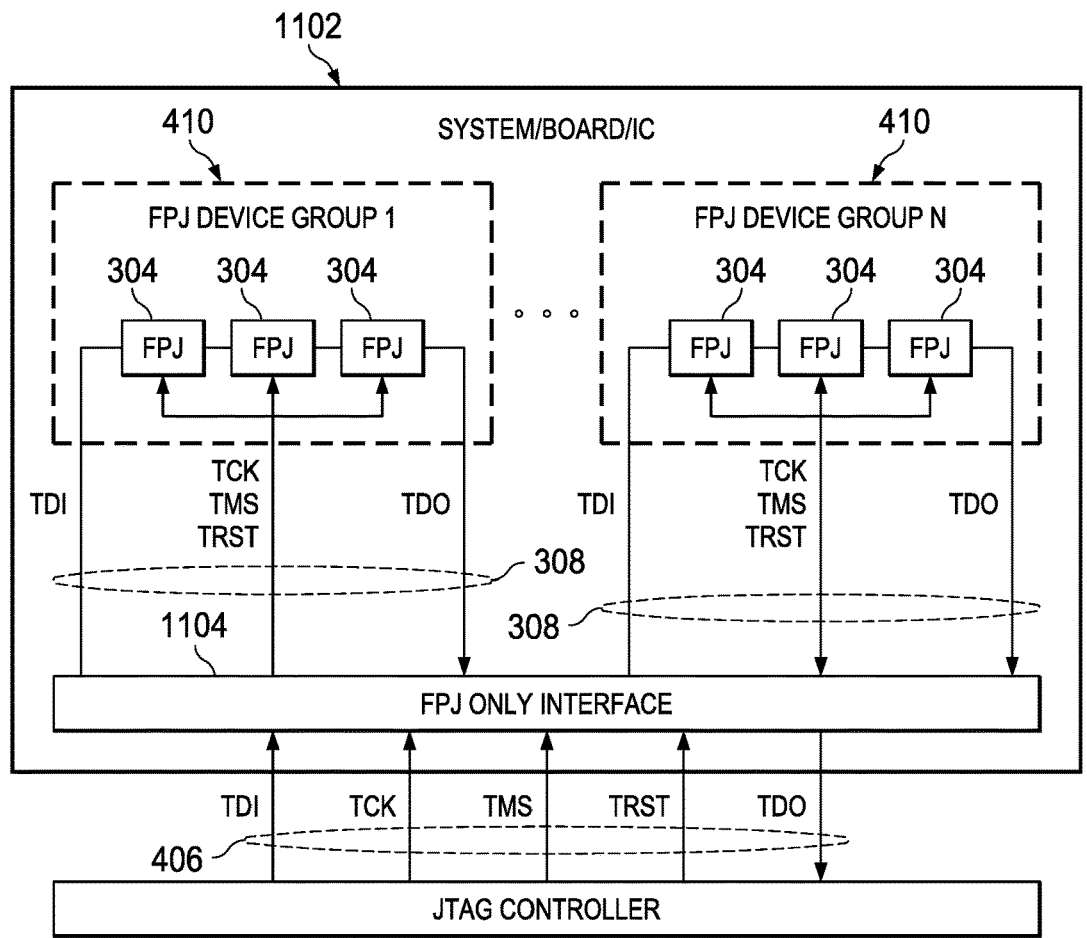
FIG. 11 illustrates a substrate containing only FPJ devices interfaced to a single JTAG controller via a FPJ Only Interface according to the disclosure.

FIG. 11 illustrates the JTAG access architecture 1102 of the disclosure adapted for only selecting FPJ device groups 410. As seen, the only difference between the architecture of FIG. 11 and FIG. 4 is that the FJP & RPJ Interface circuit 408 of FIG. 4 has been replaced with an FPJ Only Interface circuit 1104 in FIG. 11.

Figure 12:
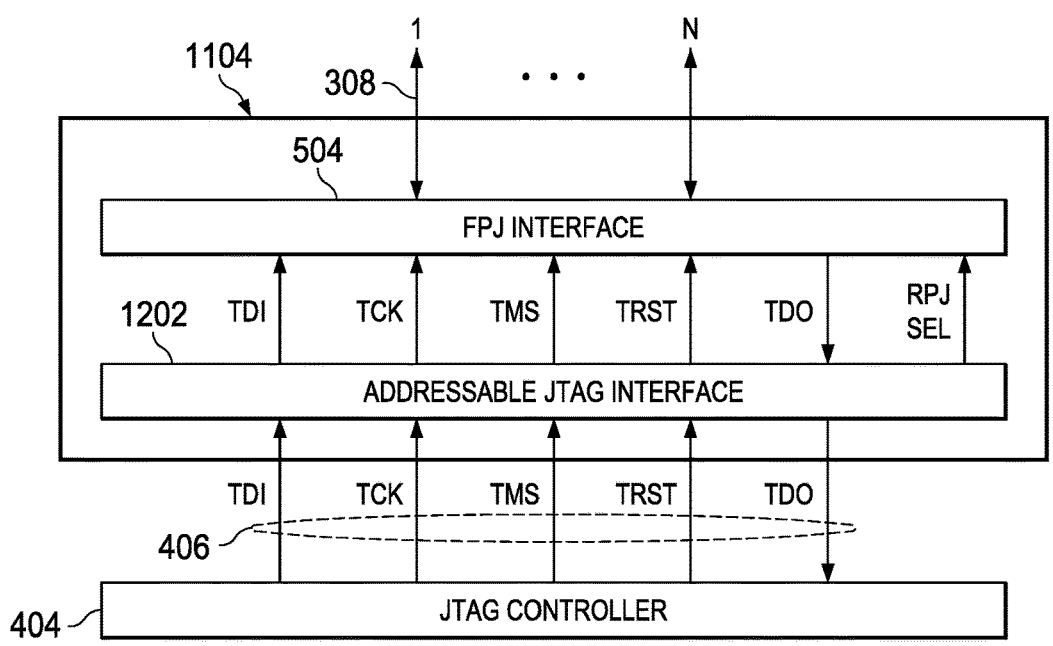
FIG. 12 illustrates the FPJ Only Interface of FIG. 11.

FIG. 12 illustrates in more detail the FPJ Only Interface 1104 of FIG. 11. As seen, the FPJ Only Interface 1104 comprises the previously described FPJ Interface 504 and a modified addressable JTAG interface 1202. The addressable JTAG interface 1202 is identical to the addressable JTAG interface 502 with the exception that the SELRPJ bus 522 and associated circuitry has been removed from shadow protocol circuit 602 of FIG. 6, the command circuit 704 of FIG. 7, and update register 842 of FIG. 8e. The procedure of selecting an FPJ device group 410 for access is the same as previously described.

Figure 13:
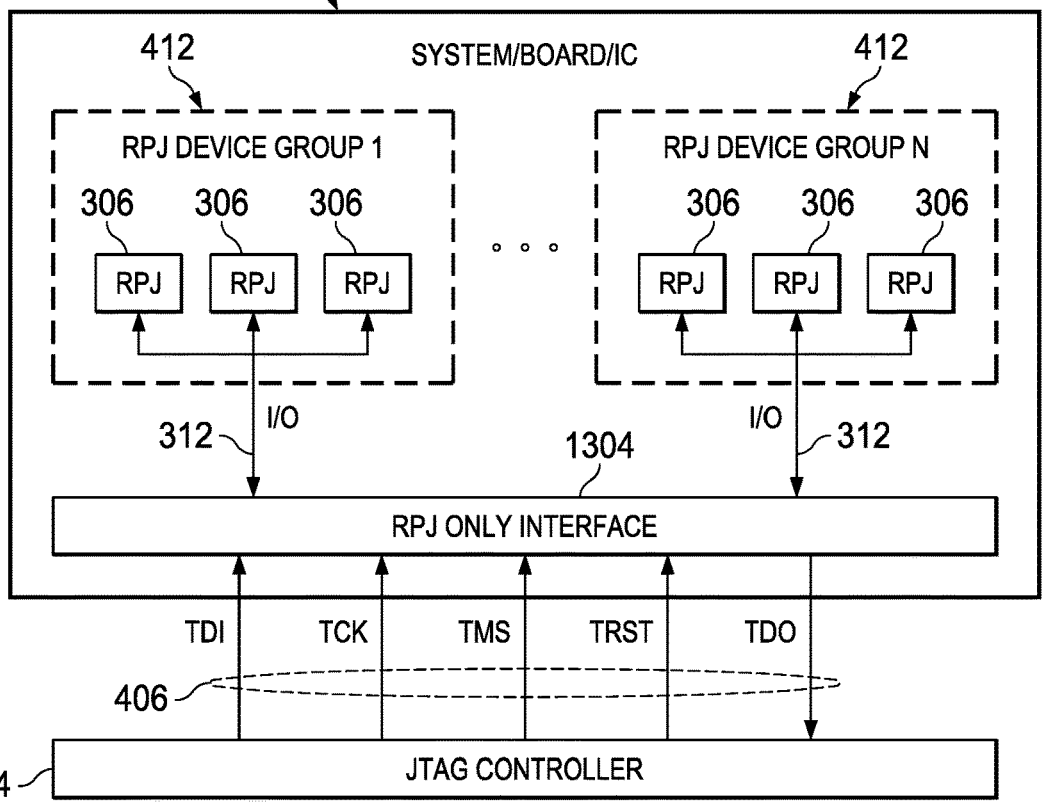
FIG. 13 illustrates a substrate containing only RPJ devices interfaced to a single JTAG controller via a RPJ Only Interface according to the disclosure.

FIG. 13 illustrates the JTAG access architecture 1302 of the disclosure adapted for only selecting RPJ device groups 412. As seen, the only difference between the architecture of FIG. 13 and FIG. 4 is that the FJP & RPJ Interface circuit 408 of FIG. 4 has been replaced with an RPJ Only Interface circuit 1304 in FIG. 13.

Figure 14:
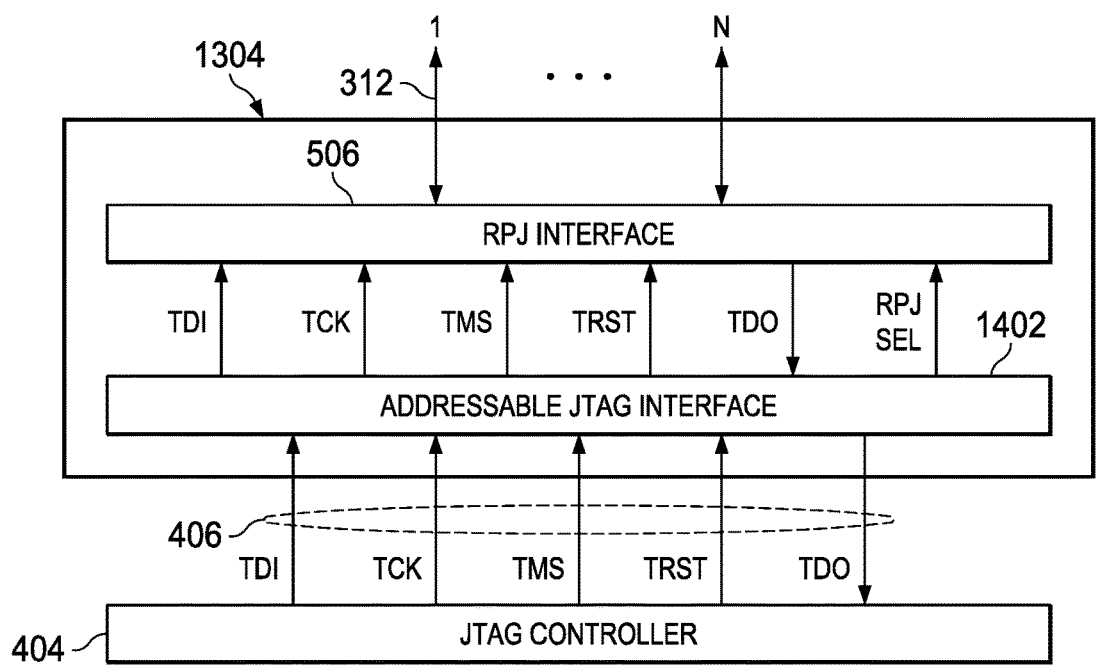
FIG. 14 illustrates the RPJ Only Interface of FIG. 13.

FIG. 14 illustrates in more detail the RPJ Only Interface 1304 of FIG. 13. As seen, the RPJ Only Interface 1304 comprises the previously described RPJ Interface 506 and a modified addressable JTAG interface 1402. The addressable JTAG interface 1402 is identical to the addressable JTAG interface 502 with the exception that the SELFPJ bus 520 and associated circuitry has been removed from shadow protocol circuit 602 of FIG. 6, the command circuit 704 of FIG. 7, and update register 842 of FIG. 8e. The procedure of selecting a RPJ device group 412 for access is the same as previously described.

Figure 15:
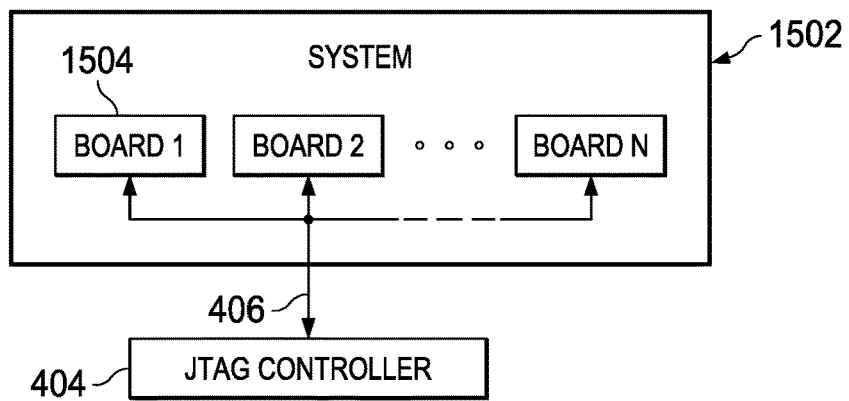
FIG. 15 illustrates a system (substrate) of boards (devices), each board comprising FPJ and/or RPJ ICs which are accessed via the architecture of the disclosure.

FIG. 15 is provided to illustrate a system 1502 comprising multiple boards 1504, each board 1504 including either the FPJ and RPJ device access architecture of FIG. 4, the FPJ Only device access architecture of FIG. 11, or the RPJ Only device access architecture of FIG. 13 to provide for a JTAG controller 404 to access FPJ and/or RPJ interfaces of ICs on the board 1104 via bus 406.

Figure 16:
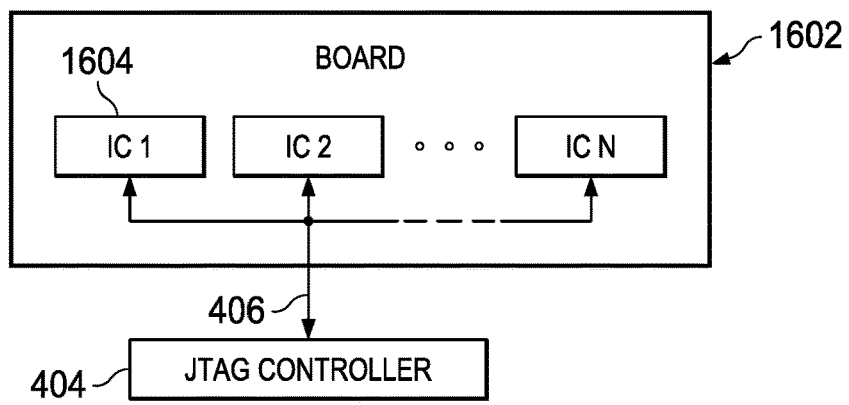
FIG. 16 illustrates a board (substrate) of ICs (devices), each IC comprising FPJ and/or RPJ cores which are accessed via the architecture of the disclosure

FIG. 16 is provided to illustrate a board 1602 comprising multiple ICs 1604, each IC 1604 including either the FPJ and RPJ device access architecture of FIG. 4, the FPJ Only device access architecture of FIG. 11, or the RPJ Only device access architecture of FIG. 13 to provide for a JTAG controller 404 to access FPJ and/or RPJ interfaces of embedded cores within each IC 1604 via bus 406.

Figure 17:
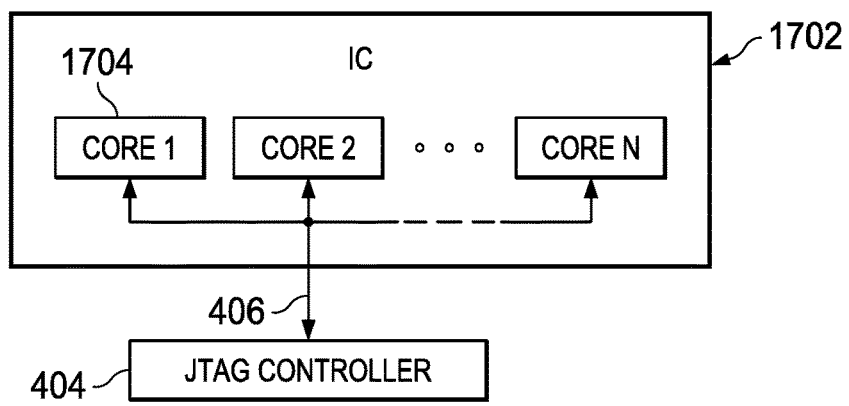
FIG. 17 illustrates an IC (substrate) of cores (devices), each core comprising FPJ and/or RPJ sub-cores which are accessed via the architecture of the disclosure.

FIG. 17 is provided to illustrate an IC 1702 comprising multiple embedded cores 1704, each embedded core 1704 including either FPJ and RPJ device access architecture of Figure, the FPJ Only device access architecture of FIG. 11, or the RPJ Only device access architecture of FIG. 13 to provide for a JTAG controller 404 to access FPJ and/or RPJ interfaces of further embedded cores within each embedded core 1704 via bus 406.

Figure 18:
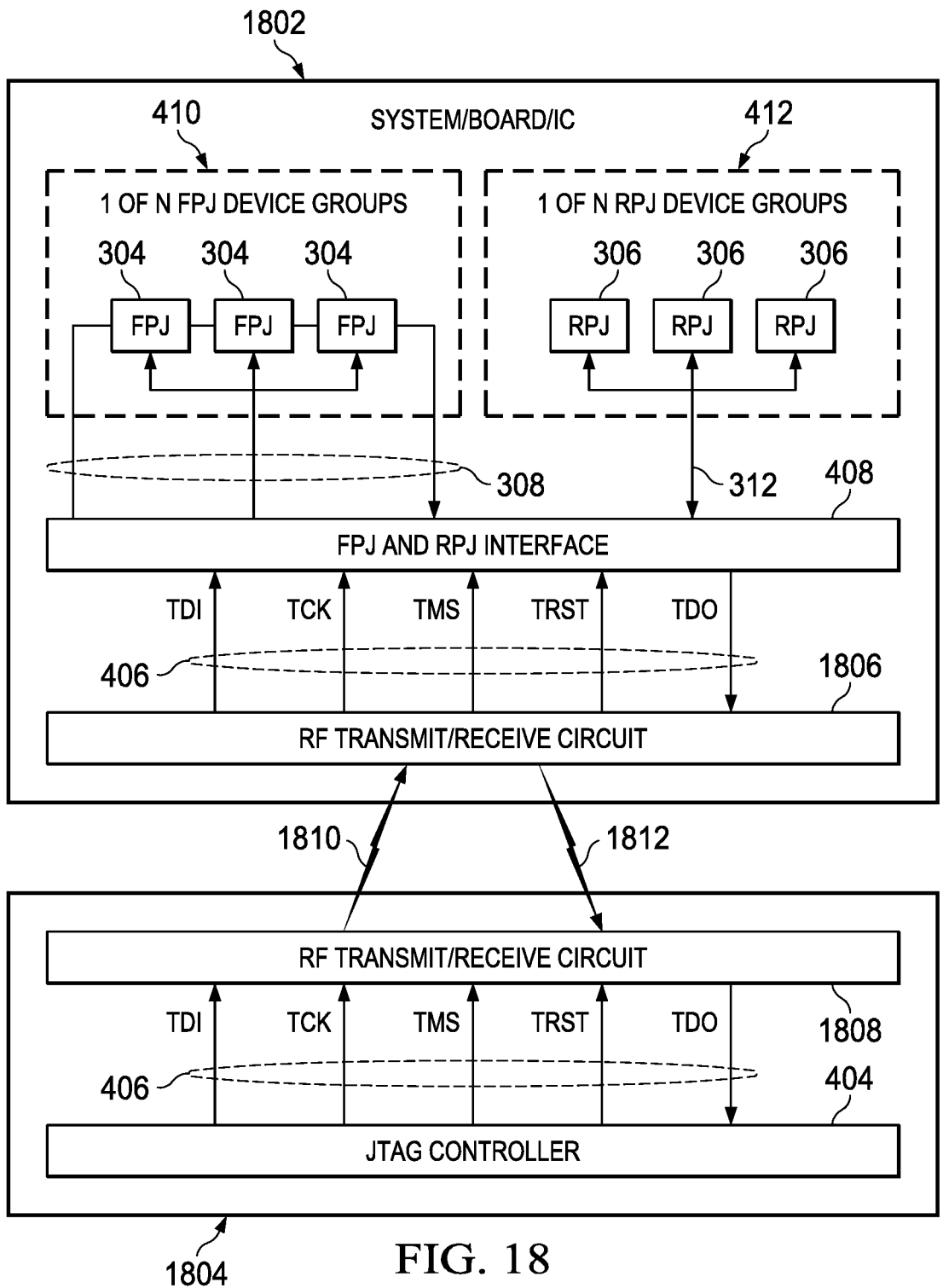
FIG. 18 illustrates the FPJ & RPJ access architecture of the disclosure adapted to utilize wireless communication between the substrate (system/board/IC) and JTAG controller.

FIG. 18 is provided to illustrate how the FPJ and RPJ device access architecture 402 of FIG. 4 may be adapted to provide for wireless transmit 1810 and receive 1812 communication with the adapted architecture 1802 of FIG. 18 from a wireless JTAG controller 1804. The FPJ and RPJ access architecture 1802 is the same as the FPJ and RPJ access architecture 402 of FIG. 4 with the exception that an RF transmit/receive circuit 1806 has been coupled to bus 406 of the FJJ & RPJ Interface 408 to provide for wireless communication with the wireless JTAG controller 1804. The wireless JTAG controller 1804 is the same as the JTAG controller 404 of FIG. 4 with the exception that an RF transmit/receiver circuit 1808 has been coupled to bus 406 of the JTAG controller 404 to provide the wireless communication with the RF transmit/receive circuit 1806 of FPJ and RPJ access architecture 1802. With the exception of the wireless communication, the operation of the wireless JTAG controller 1804 and wireless FPJ and RPJ device access architecture 1802 is the same as previously described.

Figure 19:
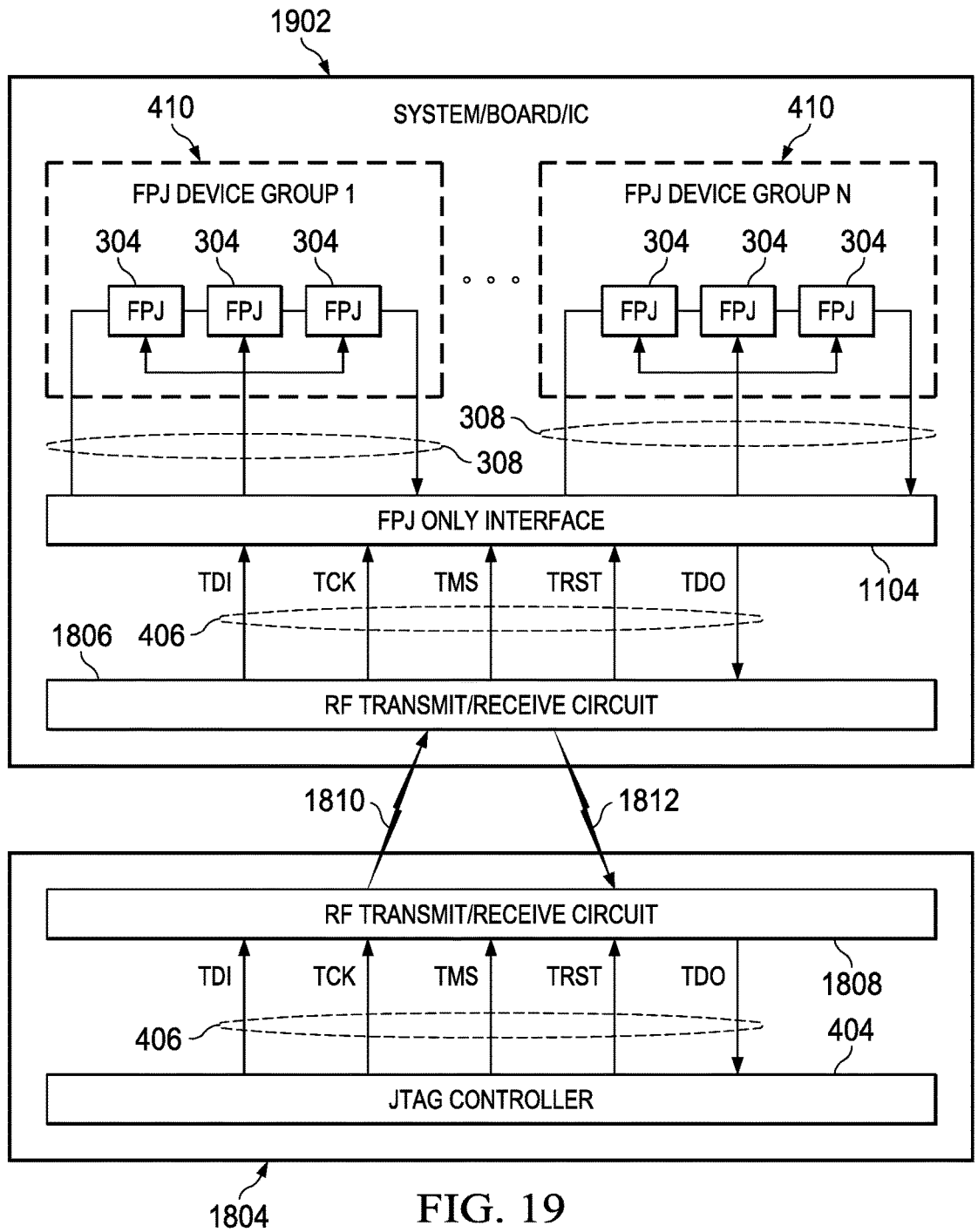
FIG. 19 illustrates the FPJ Only access architecture of the disclosure adapted to utilize wireless communication between the substrate (system/board/IC) and JTAG controller.

FIG. 19 is provided to illustrate how the FPJ Only device access architecture 1102 of FIG. 11 may be adapted to provide for wireless transmit 1810 and receive 1812 communication with the adapted architecture 1902 of FIG. 19 from a wireless JTAG controller 1804. The FPJ Only access architecture 1902 is the same as the FPJ Only access architecture 1102 of FIG. 11 with the exception that an RF transmit/receive circuit 1806 has been coupled to bus 406 of the FPJ Only Interface 1104 to provide for wireless communication with the wireless JTAG controller 1804. The wireless JTAG controller 1804 is the same as described in regard to FIG. 18. With the exception of the wireless communication, the operation of the wireless JTAG controller 1804 and wireless FPJ Only device access architecture 1902 is the same as previously described.

Figure 20:
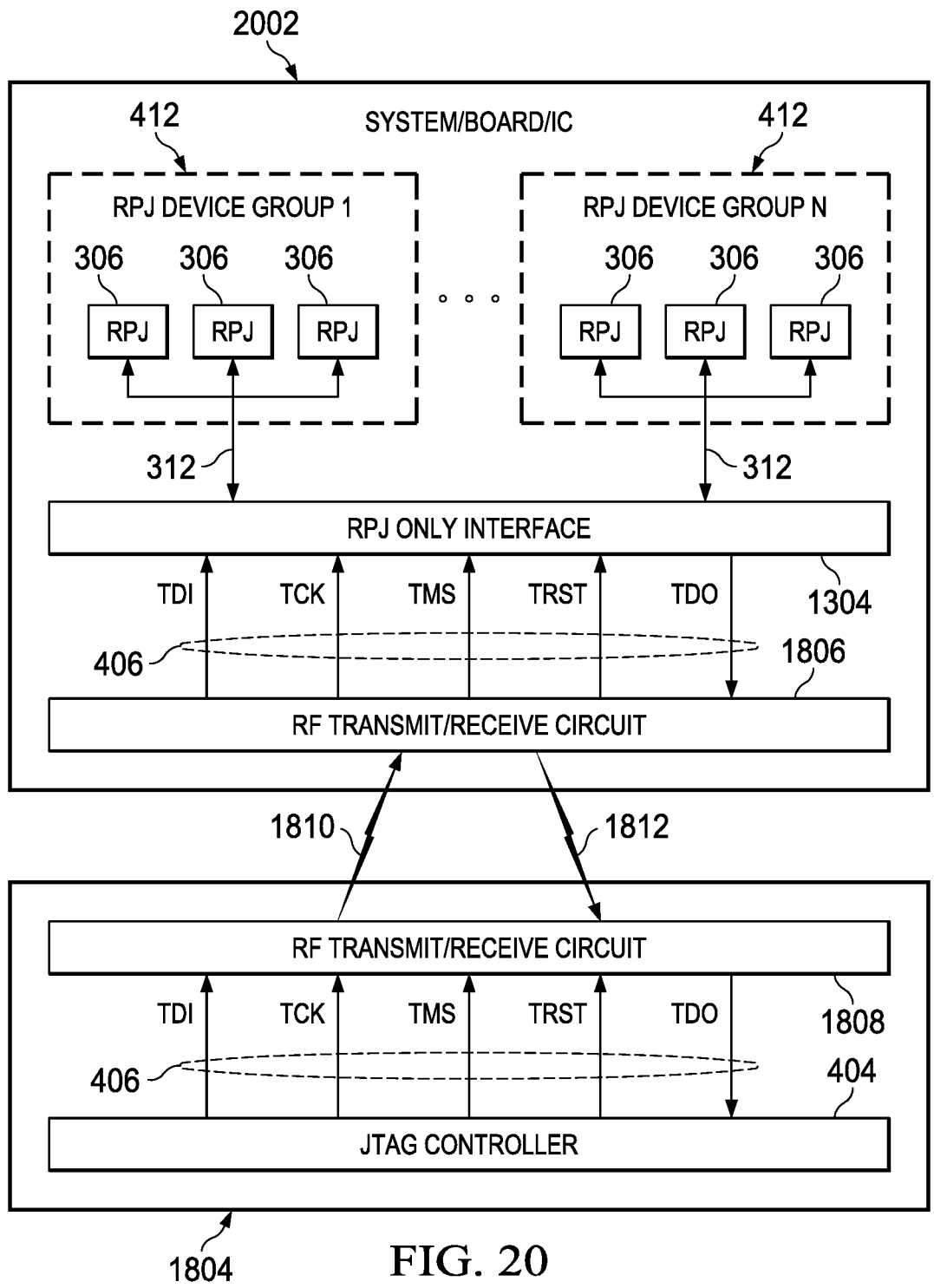
FIG. 20 illustrates the RPJ Only access architecture of the disclosure adapted to utilize wireless communication between the substrate (system/board/IC) and JTAG controller.

FIG. 20 is provided to illustrate how the RPJ Only device access architecture 1302 of FIG. 13 may be adapted to provide for wireless transmit 1810 and receive 1812 communication with the adapted architecture 2002 of FIG. 20 from a wireless JTAG controller 1804. The RPJ Only access architecture 2002 is the same as the RPJ Only access architecture 1302 of FIG. 13 with the exception that an RF transmit/receive circuit 1806 has been coupled to bus 406 of the RPJ Only Interface 1304 to provide for wireless communication with the wireless JTAG controller 1804. The wireless JTAG controller 1804 is the same as described in regard to FIG. 18. With the exception of the wireless communication, the operation of the wireless JTAG controller 1804 and wireless RPJ Only device access architecture 2002 is the same as previously described.

Various wireless JTAG access schemes are known in the art. One example of wireless JTAG access is described in a paper published in the 2004 VLSI Test Symposium proceedings by Hans Eberle, titled "Testing Systems Wirelessly," which is incorporated and referenced herein. The wireless interface circuits 1806 and 1808 for FIGS. 18, 19, and 20 could use the wireless interface described in this paper, or any other type of wireless JTAG interface.

FIG. 18 illustrates the combined use of a wireless interface and the FPJ and RPJ access architecture to wirelessly select and access FPJ and RPJ devices on a substrate.

FIG. 19 illustrates the combined use of a wireless interface and the FPJ Only access architecture to wirelessly select and access FPJ devices on a substrate.

FIG. 20 illustrates the combined use of a wireless interface and the RPJ Only access architecture to wirelessly select and access RPJ devices on a substrate.

Although the disclosure has been described in detail, it should be understood that various changes, substitutions and alterations may be made without departing from the spirit and scope of the disclosure as defined by the appended claims.

What is claimed is:

1. A process of operating a shadow protocol circuit comprising:
   (a) receiving in a state monitor circuit of the shadow protocol circuit a test clock signal, a test mode select signal, and a test reset signal;
   (b) producing from the state monitor circuit an enable signal when the test clock signal, the test mode select signal, and the test reset signal indicate a particular state;
   (c) receiving in a state machine the test clock signal, the test reset signal, and the enable signal, and a test data input signal;
   (d) producing from the state machine an address signal and an address control signal in response to receiving the enable signal and receiving on the test data input signal a message that includes an address field.

2. The process of claim 1 in which producing an enable signal includes producing the enable signal upon indication of a Run Test/Idle state.

3. The process of claim 1 in which producing an enable signal includes producing the enable signal upon indication of a Pause-DR state.

4. The process of claim 1 in which producing an enable signal includes producing the enable signal upon indication of a Pause-IR state.

5. The process of claim 1 including not producing an enable signal from the state monitor circuit when the test clock signal, the test mode select signal, and the test reset signal indicate a state other than Run Test/Idle, Pause-DR and Pause-IR.

6. The process of claim 1 including producing a reset signal from the state monitor circuit when the test clock signal and the test mode select signal indicate a Test Logic Reset state.

* * * * *